(12) United States Patent
Fujita et al.

(10) Patent No.: US 10,048,333 B2
(45) Date of Patent: Aug. 14, 2018

(54) MAGNETIC RESONANCE IMAGING (MRI) COIL WITH CONSTANT CAPACITANCE COUPLING

(71) Applicant: Quality Electrodynamics, LLC, Mayfield Village, OH (US)

(72) Inventors: Hiroyuki Fujita, Highland Hights, OH (US); Oliver Heid, Erlangen (DE); Xiaoyu Yang, Highland Hights, OH (US)

(73) Assignee: Quality Electrodynamis, LLC, Mayfield Village, OH (US)

( * ) Notice: Subject to any disclaimer, the term of this patent is extended or adjusted under 35 U.S.C. 154(b) by 558 days.

(21) Appl. No.: 14/728,627

(22) Filed: Jun. 2, 2015

(65) Prior Publication Data

US 2016/0356867 A1 Dec. 8, 2016

(51) Int. Cl.
*G01V 3/00* (2006.01)
*G01R 33/36* (2006.01)
*H01F 5/04* (2006.01)

(52) U.S. Cl.
CPC ..... *G01R 33/3642* (2013.01); *G01R 33/3621* (2013.01); *H01F 5/04* (2013.01)

(58) Field of Classification Search
CPC .. G01R 33/34; G01R 33/34007; G01R 33/36; G01R 33/3635; G01R 33/3642; G01R 33/48; G01R 33/4818; G01R 33/481; G01R 33/4824; G01R 33/446; G01R 33/4835; G01R 33/54; G01R 33/543; G01R 33/561; G01R 33/563; G01R 33/565; G01R 33/5612; G01R 33/583; G01R 33/5659; G01R 33/56518; G01R 33/56536; G01R 33/56572; G01R 33/5611; G01R 33/5614; G01R 33/5616; G01R 33/56509; G01R 33/341; G01R 33/385; G01R 33/56358; G01R 33/4828; A61B 5/055; A61B 5/0555; A61B 5/7278; A61B 5/725
USPC .................................................. 324/300–322
See application file for complete search history.

(56) References Cited

U.S. PATENT DOCUMENTS

| | | | |
|---|---|---|---|
| 9,891,299 B1* | 2/2018 | Stormont | G01R 33/3873 |
| 2008/0197849 A1* | 8/2008 | Heid | G01R 33/56375 |
| | | | 324/318 |
| 2009/0315556 A1* | 12/2009 | Driemel | G01R 33/3415 |
| | | | 324/307 |

(Continued)

*Primary Examiner* — Thang Le
(74) *Attorney, Agent, or Firm* — Eschweiler & Potashnik, LLC

(57) ABSTRACT

Example minimalist magnetic resonance imaging (MRI) radio frequency (RF) coils that are connected to off coil circuitry by capacitive coupling plates are described. A minimalist MRI RF coil may have some elements that form a traditional coil located off the coil in off coil circuitry. An MR procedure may involve a number of minimalist MRI RF coils that are moved through an excitation zone as a patient is moved through the excitation zone. Example minimalist MRI RF coils may be selectively connected to off coil circuitry while the coils are in the excitation zone. The coupling may be made by capacitive coupling plates. Unlike conventional systems, example systems have capacitive coupling plates with properties that facilitate maintaining a constant capacitance between a coupling plate associated with the coil and coupling plates associated with the off coil circuitry as the coupling plates move relative to each other.

18 Claims, 19 Drawing Sheets

(56) References Cited

U.S. PATENT DOCUMENTS

| | | | | |
|---|---|---|---|---|
| 2011/0148415 A1* | 6/2011 | Boskamp | ............ | G01R 33/365 |
| | | | | 324/318 |
| 2014/0253126 A1* | 9/2014 | Habara | ............. | G01R 33/3415 |
| | | | | 324/322 |
| 2016/0135711 A1* | 5/2016 | Dohata | ............... | A61B 5/0555 |
| | | | | 600/422 |

* cited by examiner

MAGNETIC RESONANCE IMAGING (MRI) COIL WITH CONSTANT CAPACITANCE COUPLING

FIELD OF TECHNOLOGY

The following relates to embodiments of a magnetic resonance imaging (MRI) radio frequency (RF) coils that are connected to off coil circuitry by capacitive coupling plates.

BACKGROUND

Magnetic resonance imaging (MRI) involves the transmission and receipt of radio frequency (RF) energy. RF energy may be transmitted by a coil. Resulting magnetic resonance (MR) signals may also be received by a coil. Conventionally, MR coils have had a set of elements that included a long copper trace arranged in a loop in which an electric current could be induced by nuclear magnetic resonance (NMR) signals produced by an object near the loop. The set of elements also included other items including capacitors, resistors, pre-amplifiers, a PIN diode, or additional signal processing elements. Conventionally, each coil had all of the elements. Some minimalist coils have been designed where some RF coil elements are removed from the coil. These minimalist coils have been used in MR procedures where a patient may be moved during the procedure.

An MRI procedure may employ several coils. In a conventional situation, even when each of the several coils had all of the conventional RF coil elements, only selected coils (e.g., coils in the excitation zone produced by the MRI apparatus) were in use at any given time. Even though only some coils were in use at any time, each coil needed to be manually plugged into an apparatus that would allow the selective use of a coil as it was needed. Plugging in the coils and checking that they were attached to the apparatus correctly consumed operator time and produced opportunities for errors. The operator time occurred while the patient was lying on the MR apparatus waiting for their scan. Also, plugging in and then unplugging the connectors produced wear and tear that may have led to the connectors breaking or needing servicing, which may have led to down time for the MRI apparatus.

United States patent application 2009/0315556 ('556) is incorporated herein by reference. In conventional coils, the inductors, capacitors, resistors, PIN diodes, or other circuit elements were all located on the MR coil. In the '556, some of these elements were moved off the MR coil and were only accessed via a coupling interface. Unfortunately, conditions at the coupling point may have created varying capacitance for the MR coil, which may have had negative impacts on coil use.

'556 describes a "contacting system" for bringing MR local coils in contact with MR coil circuitry that was moved off the MR coil. The contacting system has "a number of coil coupler elements that are electronically connected with the MR local coils and apparatus coupler elements that are mounted on the MR scanner housing and that are electrically connected with the unit for additional signal processing. '556 describes how "the coil coupler elements and the apparatus coupler elements are fashioned so that given a movement of the local coils in the MR scanner a successive contacting of at least a portion of the coil coupler elements with apparatus coupler elements ensues at least over a specific path segment." For example, as a table holding a patient moves in and out of an MR apparatus, the coil coupler elements of different local coils come in contact with the apparatus coupler elements to complete a circuit that allows signals received in the MR local coils to be passed to the circuits that were moved to the apparatus. While the '556 facilitates having a minimalist MR coil by moving MR coil circuitry off the MR coil, the '556 also produces a new problem that did not exist before the MR coil coupler element to apparatus coil coupler element approach was used.

The '556 identifies the problem in [0055], which reads "the signal transmission is adulterated by a variation of the capacitance." The capacitance of an MR coil affects the performance of the MR coil. Recall that an imaging coil needs to be able to resonate at a carefully selected Larmor frequency. Imaging coils include inductive elements and capacitive elements. The resonant frequency, v, of an RF coil is determined by the inductance (L) and capacitance (C) of the inductor capacitor circuit according to:

$$v = \frac{1}{2\prod \sqrt{LC}}$$

The '556 moves some elements that are involved in tuning from an MR coil to a separate apparatus and then selectively couples the simpler MR coil to the additional elements on an as-needed basis using couplers on both the MR coil and the separate apparatus. The '556 allows coupling of minimalist MR coils to additional signal processing elements in a fashion that facilitates continuous movement of a subject positioning device (e.g., table on which patient is lying in MR scanner). In the '556, some of the L and C may occur due to elements on the local MR local coil, some of the L and C may occur due to elements that were moved off the local MR coil, and some of the L and C may occur at the coupling point between the MR coil coupling elements and the apparatus coupling elements. Due to the relative motion of the coupling elements, the capacitance at the coupling point may vary. Varying capacitance produces a sub-optimal tuning situation.

Imaging coils may need to be tuned. Tuning an imaging coil may include varying the performance of a capacitor. Recall that frequency: $f=\omega/(2\pi)$, wavelength: $\lambda=c/f$, and $\lambda=4.7$ m at 1.5 T. Recall also that the Larmor frequency: $f_0=\gamma B_0/(2\pi)$, where $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$). These equations and relationships aren't just convenient descriptions for MR coils; they are design requirements for being able to produce coils that actually receive NMR signals.

Referring to Related Art FIG. 1, a single RF coil segment 102 is shown schematically to include an inductance 103, a resistance 104, and a capacitance 105. Capacitance 105 is selected and controlled to tune the segment 102 to a desired frequency (e.g., Larmor frequency). The RF coil segment 102 is connected across the output of a current control circuit 106 that is driven by an input signal 107 to produce a current in the RF coil segment 102. In the '556, some of the elements illustrated for coil 102 may remain on the minimalist coil while some of the elements may be moved off the coil (e.g., to the MR apparatus). The minimalist coil may then be connected using the coil coupling elements and apparatus coupling elements described in the '556. Unfortunately, coupling approaches and designs like those described in the '556 and elsewhere may unacceptably vary the capacitance of coil segment 102 and thus negatively impact tuning.

There are many design issues associated with MRI RF coil design. For example, the inductance of a conventional coil depends on the geometry of the coil. For a square coil with a side length a and wire diameter f: $L=[\mu_0/\pi]$ $[-4a+2a\sqrt{2}-2a \log(1+\sqrt{2})+2a \log(4a/f)]$. For a loop coil with loop diameter d and wire diameter f: $L=[\mu_0 d/2]$ $[\log(8d/f)-2]$. Thus, the selection of the geometry of a coil determines, at least in part, the inductance of the coil.

The resistance of a coil also depends on the geometry of the coil. The resistance R of a conductor of length l and cross-sectional area A is $R=\rho l/A$, where $\rho$ is the conductor resistivity and is a property of the conductor material and the temperature. For a copper wire coil with loop diameter d and wire diameter f: $R=d\rho_{Cu}/(f\delta_{Cu})$. For a copper foil coil with loop diameter d, copper thickness t, and copper width w: $R=\pi d\rho_{Cu}/(2w\delta_{Cu})$, where t is much greater than the copper skin depth and w is much greater than t. Thus, the selection of the geometry of a coil and the material (e.g., wire, foil) determines, at least in part, the inductance of the coil. The length of the loop also impacts the properties of the coil.

Coils may be characterized by their signal voltage, which is the electro-motive force (emf) induced in a coil: $\xi=-\partial\varphi/\partial t \propto -\partial(B_1 \cdot M_0)\partial t$, where $\varphi$ is the magnetic flux across the coil (closed loop), magnetization $M_0=N\gamma^2(h/(2\pi))^2 s(s+1)B_0/(3k_B T_S)=\sigma_0 B_0/\mu_0$, where N is the number of nuclear spins s per unit volume (s=½ for protons) and $T_s$ is the temperature of the sample. Since $\omega_0=\gamma B_0$, $\xi \propto \omega_0^2$. The noise in a coil may be thermal (e.g., $v=(4k_B T_S R\Delta f)^{1/2}$, where R is the total resistance and $\Delta f$ is the bandwidth of the received signal). The signal to noise ratio (SNR) for a coil may be described by $\xi/v$.

Coils may be used for transmitting RF energy that is intended to cause NMR in a sample. The frequency at which NMR will be created depends on the magnetic field present in the sample. Both the main magnetic field B0 produced by the MRI apparatus and the additional magnetic field B1 produced by a coil contribute to the magnetic field present in the sample. For a circular loop coil, the transmit B1 field equals the coil sensitivity. A circular loop of radius a carrying a current I produces on axis the field: $B=\mu_0 I a^2/[2(a^2+z^2)^{3/2}]$.

RF coils for MRI may need to be tuned and matched. Tuning involves establishing or manipulating the capacitance in a coil so that a desired resistance is produced. Matching involves establishing or manipulating the capacitance/inductance at a feeding point of a coil so that a desired impedance (e.g., 50 Ohm) is achieved. If the capacitance at a coupling point between a minimalist RF coil and circuitry with off-coil elements varies, then tuning and matching may be complicated. When tuning, the impedance z may be described by $Z=R+jX=1/(1/(r+jL\omega)+jC\omega)$. Tuning may be performed to achieve a desired tuning frequency for a coil. $\omega_0$ identifies the desired tuning frequency. $\omega_0$, may be, for example, 63.87 MHz at 1.5 T. The size of a conventional coil facilitates estimating inductance L. With an estimate of L available, values for capacitors can be computed to produce a desired resonant peak in an appropriate location with respect to $\omega_0$. Once capacitors are selected, the resonant peak can be observed and a more accurate L can be computed. The capacitors or inductor at the feeding point can then be adjusted to produce the desired resistance for matching.

Conventional coils may use PIN diodes. When forward-biased, a PIN diode may produce a negligible resistance (e.g., 0.5Ω), which is essentially a short-circuit. When reverse-biased, a PIN diode may produce a high resistance (e.g., 200 kΩ) in parallel with a low capacitance (e.g., ~2 pF), which is essentially an open-circuit.

Related Art FIG. 2 illustrates a schematic of a simple conventional RF coil 200 for MRI. The coil 200 is illustrated as a loop 210. Loop 210 has elements that produce a resistance (R) (e.g., resistor 220) and that produce an inductance (L) (e.g., inductor 230). A conventional loop may include a matching capacitor 240 and tuning capacitor 250 that produce capacitance (C). The simple RF coil 200 may be referred to as an LC coil or as an RLC coil. Conventionally, the resistor 220, inductor 230, and capacitor 250 may all have been two terminal passive elements that were soldered to copper wire or copper foil that was attached to a printed circuit board. The resistor 220, inductor 230, and capacitor 250 may all have been on the RF coil 200. Example minimalist coils may move part of resistor 220, inductor 230, or capacitor 250 to off-coil circuitry with which a selective coupling is made. Variable capacitance in the selective coupling may negatively impact the performance of coil 200.

A resistor may be, for example, a passive, two-terminal electrical component that implements electrical resistance as a circuit element. Resistors reduce current flow. Resistors may have fixed resistances or variable resistances. The current that flows through a resistor is directly proportional to the voltage applied across the resistor's terminals. This relationship is represented by Ohm's Law: V=IR, where I is the current through the conductor, V is the potential difference across the conductor, and R is the resistance of the conductor.

An inductor, which may also be referred to as a coil or reactor, may be a passive two-terminal electrical component that resists changes in electric current. An inductor may be made from, for example, a wire that is wound into a coil. When a current flows through the inductor, energy may be stored temporarily in a magnetic field in the coil. When the current flowing through the inductor changes, the time-varying magnetic field induces a voltage in the inductor. The voltage will be induced according to Faraday's law and thus may oppose the change in current that created the voltage.

A capacitor may be a passive, two-terminal electrical component that is used to store energy. The energy may be stored electrostatically in an electric field. Although there are many types of practical capacitors, capacitors tend to contain at least two electrical conductors that are separated by a dielectric. The conductors may be, for example, plates and the dielectric may be, for example, an insulator. The conductors may be, for example, thin films of metal, aluminum foil or other materials. The non-conducting dielectric increases the capacitor's charge capacity. The dielectric may be, for example, glass, ceramic, plastic film, air, paper, mica, or other materials. Unlike a resistor, a capacitor does not dissipate energy. Instead, a capacitor stores energy in the form of an electrostatic field between its conductors.

When there is a potential difference across the conductors, an electric field may develop across the dielectric. The electric field may cause positive charge (+Q) to collect on one conductor and negative charge (−Q) to collect on the other conductor.

Related Art FIG. 3 illustrates a schematic of another simple RF coil 300 for MRI. RF coil 300 may also be referred to as an LC coil or as an RLC coil. The coil 300 is illustrated as a square loop 310. Loop 310 has elements that produce a resistance (e.g., resistor 320) and that produce an inductance (e.g., inductor 330). A conventional loop may include a capacitor 340 and capacitor 350 that work together to achieve matching. Once again, the resistor 320, inductor 330, and capacitors 340 and 350 may have been soldered to copper wire or copper foil that was attached to a printed circuit board. Coil 300 is contrasted with coil 200 (Related Art FIG. 2) that included capacitor 250 for tuning purposes. When the resistors, inductors, capacitors, or other circuit elements are located across an interface between a coil coupling element and an apparatus coupling element that produces varying capacitance, tuning even simple RF coil 300 may be difficult, if even possible at all.

Coils in close proximity to each other may need to be decoupled from each other. Coils may also need to be decoupled when not in use. Related Art FIG. 4 illustrates a conventional RLC coil 400 that performs decoupling using components L31 and D31. Coil 400 includes capacitors C31, C32, C33, and inductors L31, L32, and L33. Coil 400 includes a pre-amplifier circuit 410. Coil 400 also includes a PIN diode D31. Recall that a PIN diode has a wide, lightly doped near intrinsic semiconductor region positioned between a p-type semiconductor region and an n-type semiconductor region that are used for Ohmic contacts. The wide intrinsic region makes the PIN diode suitable for fast switches. Fast switching may be employed in MRI coils. In transmit mode, the PIN diode D1 may be turned off (e.g., shorted).

In conventional coil 400, a single capacitor C32 is illustrated to represent one or more capacitors that may be employed in the coil 400. Thus, capacitor C32 may be an equivalent capacitor of multiple breaking point capacitors that may appear in coil 400 minus capacitor C31. Inductor L32 represents the inductance of the coil. The inductance may be produced, for example, by a copper trace that forms the coil 400.

In the conventional coil 400, capacitor C31 is the breaking point capacitor that is used for decoupling the coil 400 from other MRI coils. Capacitor C31 and inductor L31 are in parallel resonance and the impedance across capacitor C31 is high. Capacitor C31 is a single high impedance point in coil 400. Since the impedance across capacitor C31 is high, an induced voltage on coil 400 cannot generate a large current through capacitor C32. In a conventional coil like coil 400, all the circuit elements are located on the coil. In a coil like that described in the '556, some of the circuit elements are removed from the coil and become part of the coil circuit only when the coil 400 is connected to the elements by the coil coupling element to apparatus coupling element interface. The interface may produce varying capacitance which may negatively impact tuning or decoupling of coil 400.

U.S. Pat. No. 7,602,182 ('182) is also incorporated herein by reference. The '182 describes a local coil that is operable in combination with the magnet system of an MR apparatus to generate MR signals in an examination subject and to detect MR signals resulting therefrom. The local coil is a more minimalist coil that has had some coil elements (e.g., pre-amplifier) moved off the coil and into the MR apparatus. The '182 differs from conventional systems because the local coils do not each have to be plugged in to the MR apparatus but rather are contacted on an as-needed basis as the patient is slid in or out of the bore. The '182 describes how "a local coil can be automatically coupled with an evaluation device when it is located in the excitation region and is otherwise caused to be decoupled from the evaluation device." [0017] The evaluation device refers to the MR apparatus. In the '182, the local coil is coupled to the apparatus by a "patient bed coupling element" and a "base body coupling element." These elements correspond to the coil coupling element and the apparatus coupling element of the '556. The interface between the patient bed coupling element and the base body coupling element may be galvanic, capacitive, or inductive. The interface between the patient bed coupling element and the base body coupling element may produce a variable capacitance that may negatively impact tuning or decoupling of the local coil.

The '182 describes benefits of having a minimalist coil that can be selectively coupled to circuit elements that conventionally resided on the coil. For example, the '182 describes having shorter cables that reduce attenuation and having one set of circuit elements (e.g., pre-amplifier, PIN diode) in the apparatus rather than having one set of circuit elements per coil. The '182 also describes not having to plug each coil into the evaluation unit but rather having the coils that are in the excitation region of the evaluation unit automatically connected as the patient bed moves in the bore.

The '182 describes the varying coupling that occurs as the coil coupling elements move with respect to the apparatus coupling elements. For example, the '182 describes how "a degree of coupling k1 of the first patient bed coupling element 9 with the first base body coupling element 11 is thus zero in this travel position. When the patient bed 5 is now moved further in the travel direction z, the degree of coupling k1 with which the first patient bed coupling element 9 couples with the first base body coupling element 11 increases gradually toward a maximum value. This state is reached when the first patient bed coupling element 9 and the first base body coupling element 11 are situated precisely opposite one another . . . . After this the degree of coupling k1 gradually decreases again to zero." [0073]-[0074] This variable coupling may produce conditions where capacitance may vary, which may in turn have negative implications for tuning or decoupling.

The '182 also touches on tuning a coil. See, for example, [0080]-[0082]. Unfortunately, the '182 also describes how "the patient bed coupling elements 9 are in all cases designed identically among one another" and how "the base body coupling elements 11 are also in all cases designed identically." In [0099] the '182 describes how "the coupling elements 9, 11 . . . are advantageously respectively fashioned as a pair of narrow coupling strips 34" and how "the coupling strips 34 of each coupling element 9, 11 are thereby advantageously adjacent to one another at their narrow sides to minimize the unavoidable parasitic capacitance between them." Thus, the '182 may experience the same varying capacitance issue as the '556.

According to an aspect of the present technique, a system including a coil coupler and a minimalist magnetic resonance radio frequency (MMRRF) coil is presented. The coil coupler is electrically connected to the MMRRF coil. The coil coupler being a capacitive plate. The system also includes a plurality of off coil circuitry couplers (OCCCs) electrically connected to a corresponding plurality of off coil MR circuits (OCMRC) in a one-to-one manner. The OCCC is a capacitive plate. In the system the coil coupler is moveable relative to the plurality of OCCCs by a magnetic resonance (MR) apparatus during an MR procedure. In the system, the coil coupler and the plurality of OCCCs are arranged so that the coil coupler may be in capacitive contact with N OCCCs at a time, N being an integer greater than or equal to zero. In the system, the coil coupler and the plurality of OCCCs are arranged so that one OCCC can only be in capacitive contact with at most one coil coupler at a time, and where when the coil coupler is in capacitive contact with an OCCC the coil coupler is disposed parallel to the OCCC. Furthermore in the system, when the coil coupler is in capacitive contact with a selected OCCC the MMRRF coil associated with the coil coupler is electrically connected to a selected member of the plurality of OCMRC associated with the selected OCCC, where being electrically connected to the selected member allows MR signals detected by the MMRRF coil to flow from the MMRRF coil to the selected member. In the system, when the coil coupler is in capacitive contact with one or more OCCCs and while the coil coupler is moving relative to the plurality of OCCCs, there is a constant capacitance between the coil coupler and the one or more OCCCs to which the coil coupler is in capacitive contact in the locations where the coil coupler is in capacitive contact with the one or more OCCCs, and where the constant capacitance remains within a desired range for the MMRRF coil causing the MMRRF coil to remain tuned to within a desired frequency range.

According to another aspect of the present technique, a system that includes a magnetic resonance (MR) apparatus, two or more MR coils, and two or more MR coil circuits is presented. The MR apparatus moves a patient through an excitation zone during an MR procedure. The two or more MR coils include a loop and a coil connector. The two or more MR coils are moved through the excitation zone during the MR procedure by the MR apparatus. At least one of the two or more MR coils acquires MR signals while in the excitation zone. Each MR coil circuit includes a signal processing circuit and a circuit connector. In the system, when a member of the two or more MR coils is in the excitation zone, the coil connector associated with the member of the two or more MR coils creates an electrical connection to N members of the two or more MR coil circuits via the coil connector associated with the member of the two or more MR coils and the circuit connectors associated with the N members of the two or more MR coil circuits, where N is an integer greater than or equal to one. In the system, the electrical connection allows MR signals detected in the member of the two or more MR coils to flow to the N MR coil circuits, and the electrical connection produces a constant capacitance for the member of the two or more MR coils as it moves through the excitation zone and is connected to different members of the N MR coil circuits.

According to another aspect of the present technique, a magnetic resonance (MR) apparatus is presented. The MR apparatus includes an MR data acquisition unit that acquires MR data from an examination subject interacting with the MR data acquisition unit. The MR data acquisition unit includes a local coil that participates in the acquisition of the MR data by transmitting radio frequency (RF) signals into the examination subject and by receiving resulting MR signals from the examination subject. The local coil has a coil coupler element electrically connected thereto and mounted in the MR data acquisition unit. In the MR data acquisition unit is a signal processor located remote from the local coil. A plurality of apparatus coupler elements mounted in the MR data acquisition unit are electrically connected to the signal processing unit. The MR apparatus further includes a moveable element on which the local coil is carried. The moveable element moves in a movement path in the MR data acquisition unit causing the coil coupler element to be in contact with 'N' of the plurality of apparatus coupler elements at a time, 'N' being an integer greater than or equal to zero. The coil coupler element is disposed on the moveable element and the plurality of apparatus coupler elements are disposed on the MR data acquisition unit to cause the coil coupler element to couple to N members of the apparatus coupler elements within at least a segment of the movement path. The coil coupler element and the plurality of apparatus coupler elements have shapes that produce a constant capacitance between the coil coupler element and the N apparatus coupler elements as the coil coupler element moves along the movement path, and producing the constant capacitance for the local coil while the local coil is coupled to members of the plurality of apparatus coupler elements.

According to yet another aspect of the present technique, a magnetic resonance (MR) system is presented. The MR system includes a base body having a magnet system that generates magnetic fields in an examination region of the base body. In the MR system is a patient bed that is movable in a travel direction through a travel region relative to the base body, the patient bed being configured to receive an examination subject thereon to move the examination subject through the examination region. The MR system also includes an antenna arrangement operable in combination with the magnet system to interact with the examination subject to generate MR signals in and receive MR signals from the examination subject, the antenna arrangement having a local coil configured to at least detect the MR signals. Furthermore the MR system includes an evaluation device that evaluates the MR signals detected by the local coil. In the MR system are a plurality of base body coupling elements and one or more patient body coupling elements. The plurality of base body coupling elements are connected to the evaluation device, the base body coupling elements being located at predetermined base body locations. Each of the patient bed coupling element is connected to the local coil, and is located at a predetermined patient bed location at the patient bed. In the MR system the plurality of base body coupling elements and the patient bed coupling element are respectively configured and located to couple one patient bed coupling element with N of the base body coupling elements as the local coil travels through the travel region in the travel direction to feed the MR signals detected by the local coil from the local coil via the patient bed coupling element and the base body coupling elements to the evaluation device, N being an integer greater than or equal to zero. Furthermore, the plurality of base body coupling elements and the patient bed coupling element are configured to produce a constant capacitance in the local coil as the local coil moves through the travel region in the travel direction.

BRIEF DESCRIPTION

The accompanying drawings, which are incorporated in and constitute a part of the specification, illustrate various example systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some embodiments one element may be designed as multiple elements, multiple elements may be designed as one element, an element shown as an internal component of another element may be implemented as an external component and vice versa, and so on. Furthermore, elements may not be drawn to scale.

Related Art FIG. 1 illustrates a conventional radio frequency (RF) coil for magnetic resonance imaging (MRI);

Related Art FIG. 2 illustrates portions of an RF coil for MRI;

Related Art FIG. 3 illustrates portions of an RF coil for MRI;

Related Art FIG. 4 illustrates an RF coil for MRI

DETAILED DESCRIPTION

Example apparatus allow coupling of minimalist MR coils to off coil MR circuitry (e.g., pre-amplifiers, PIN diode) in a fashion that facilitates movement of a subject positioning device while maintaining constant capacitance for the minimalist coil. The capacitance is the equivalent total capacitance of breaking point capacitances at non-decoupling points, capacitance at decoupling points, and the coupling capacitance between the coil coupler and the apparatus coupler. Keeping the constant capacitance keeps the coil resonant frequency unchanged, which in turn produces desired impacts on coil performance. The constant capacitance is maintained by the design of the MR coil coupler and the apparatus coil coupler. Maintaining the constant capacitance mitigates issues with prior designs and therefore facilitates keeping the minimalist MR coil tuned to a desired frequency.

In MRI scanners, an RF receiver channel should be connected to only one RF receive coil at any time, otherwise two or more RF coils would effectively be connected in parallel and form a closed current loop. In MRI scanners, an RF receive coil may be connected to more than one receiver channel at a time. Thus, three different scenarios may exist, a coil may be coupled to no receive channels, a coil may be coupled to one receive channel, or a coil could be coupled to two or more receive channels. In a scenario where the coils move along with the patient as the patient is moved on the MR apparatus as described in the '556 or '182 a single coil may start out not connected to any receive channel, then may be connected to a first receive channel, then may be connected to two or more receive channels, then to just one receive channel and then back to not being connected to any receive channels. In conventional systems, the coil may experience varying capacitance that negatively impacts the performance of the coil and the entire MR system.

Figure 1:
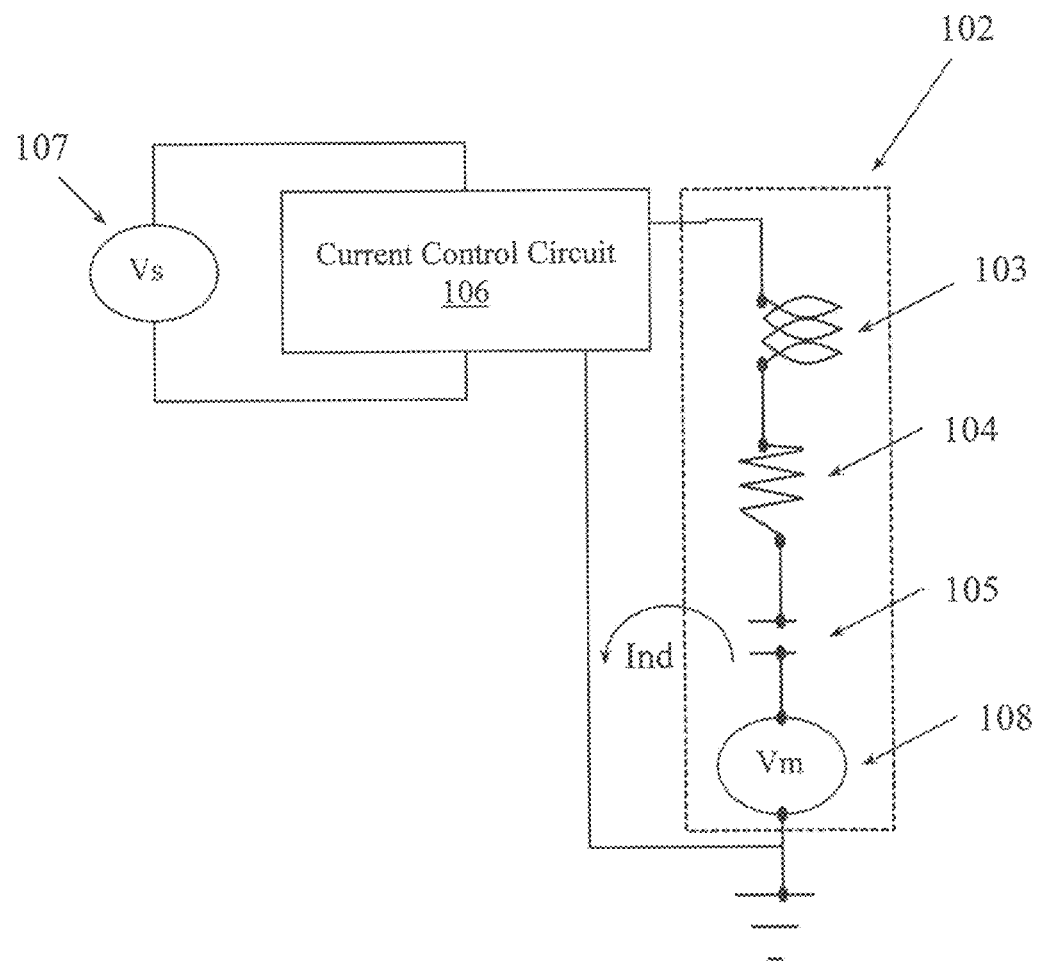
Figure 2:
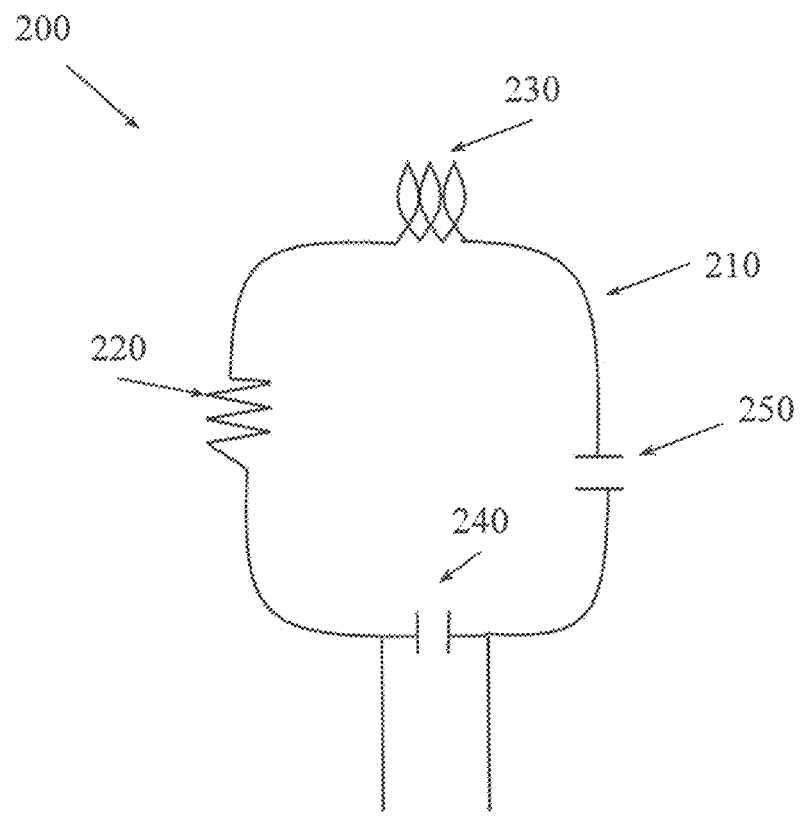
Figure 3:
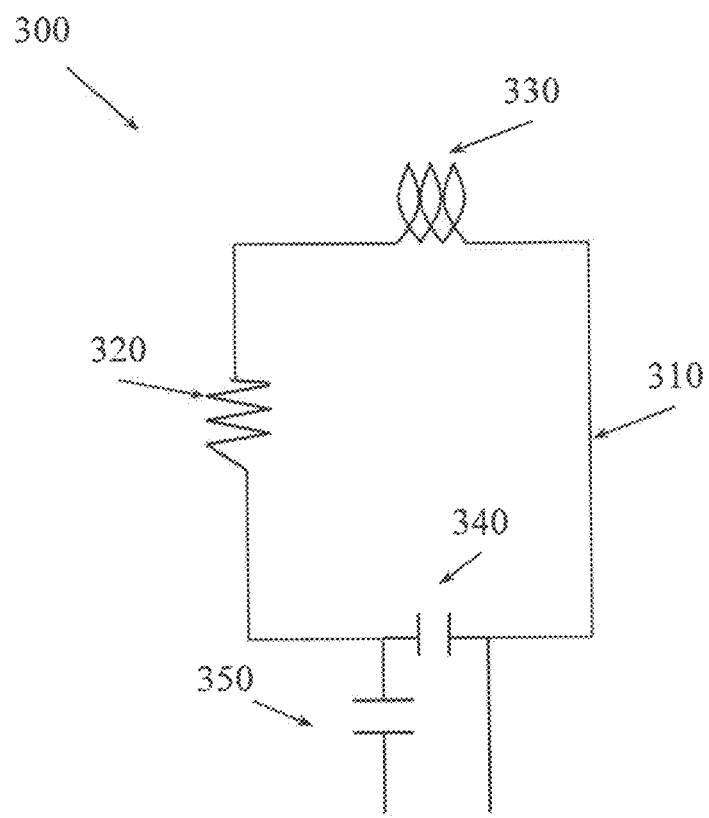
Figure 4:
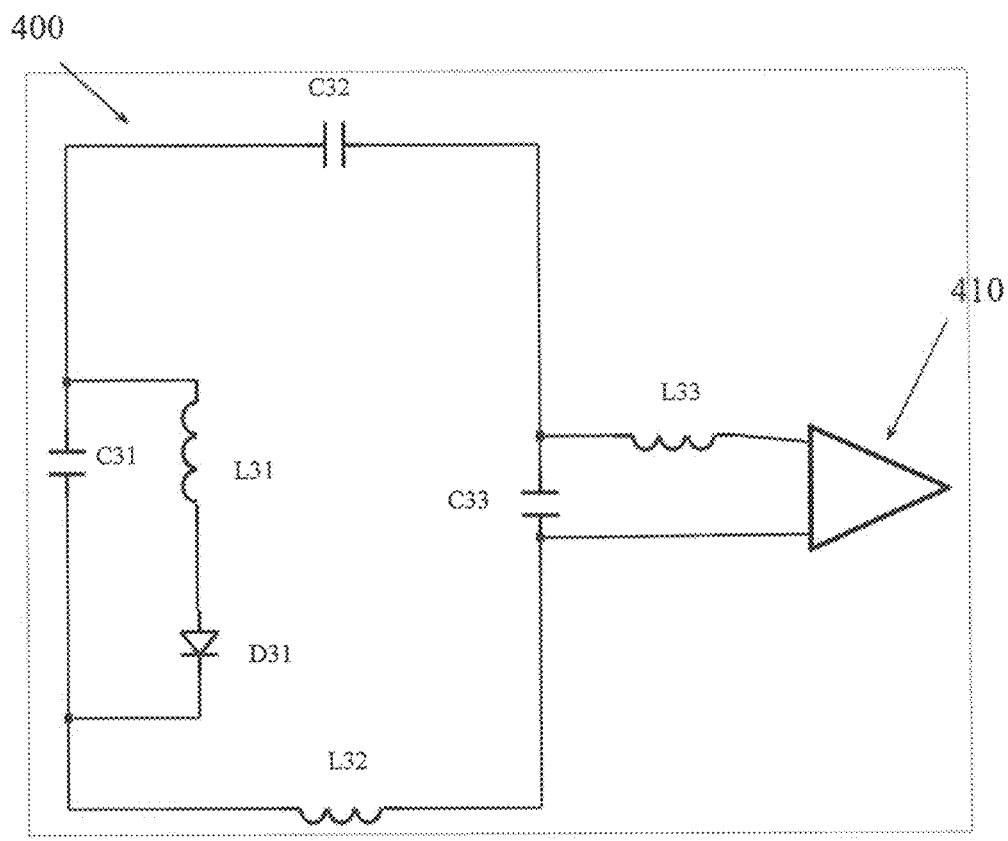
Figure 5:
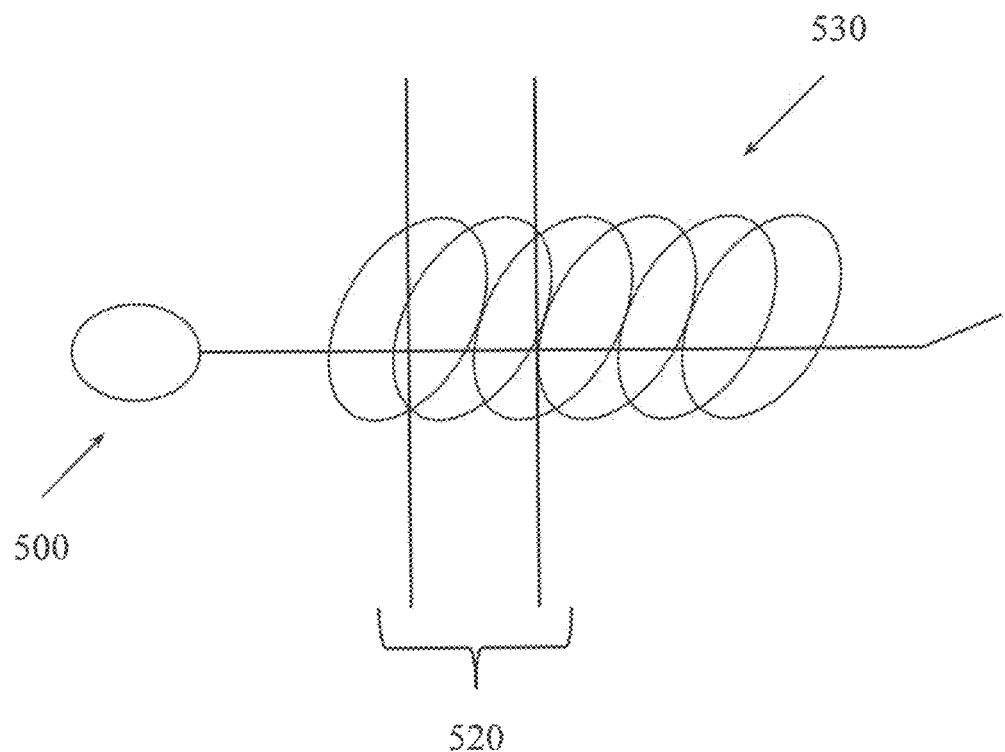
FIG. 5 illustrates a patient on which a set of minimalist RF coils have been positioned and an excitation zone produced by an MR apparatus.

FIG. 5 illustrates an examination subject or a patient 500 on which a set 530 of minimalist RF coils (hereinafter also referred to as, MMRRF coils) have been positioned. An excitation zone 520 is also illustrated in FIG. 5 which represents the spatial region in which the MR signals are generated from the patient 500 or part of the patient 500. The generated MR signals are received by the MMRRF coils that are physically present in the excitation zone 520. During an MR procedure, as the patient 500 is moved with respect to the excitation zone 520, the MMRRF coils move along with the moving patient and thus different members of the set 530 of MMRRF coils are in the excitation zone 520 at different instances of the MR procedure. The MMRRF coils present in the excitation zone at a given instance of the MR procedure detect MR signals and are required to transmit or pass on the detected signal or information corresponding to the detected signal to one or more off coil MR circuits (OCMRC) present in an MR apparatus 510 for further analysis or processing of the detected signal.

Figure 6:
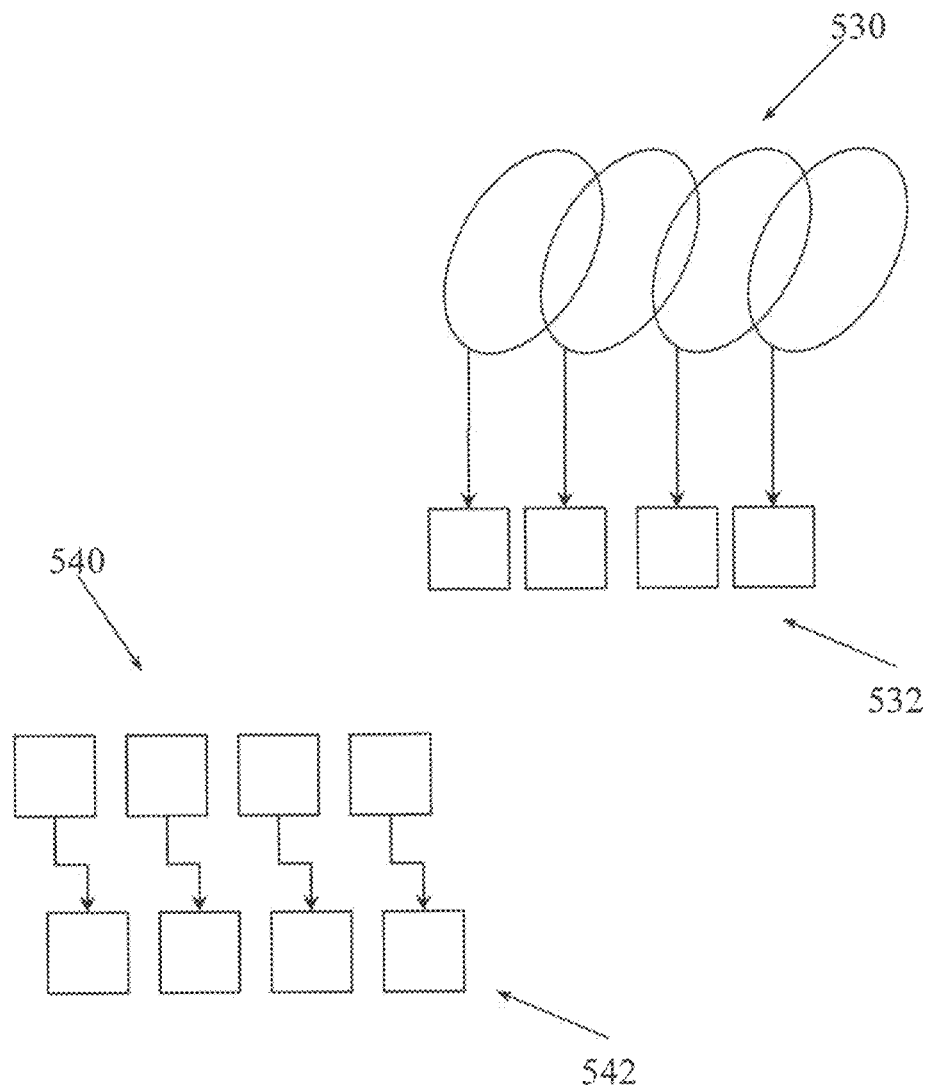
FIG. 6 illustrates a set of coil coupling elements and a set of apparatus coupling elements.

As illustrated in FIG. 6, the system of the present technique includes the set 530 of MMRRF coils and a set 540 of apparatus coupling elements or off coil circuitry couplers (OCCCs). Members of the set 530 of MMRRF coils have corresponding coil coupling elements or coil couplers 532 and the MMRRF coils are electrically connected to the coil couplers 532 and thus MR signals detected by the MMRRF coils are transmitted or sent from the MMRRF coil to the coil couplers 532. Similarly, members of the set 540 of OCCCs or apparatus coupling elements are associated with off coil circuit elements or OCMRCs 542 and the OCCCs are electrically connected to the OCMRCs and thus any signal received at the OCCCs is transmitted or sent from the OCCCs to the OCMRCs 542. The coil couplers 532 and the OCCCs 540 operate to connect members of MMRRF coils 530 with members of OCMRs 542. In FIG. 6, none of the members of set 530 are connected to any of the members of set 542, and thus none of the MMRRFs are connected to any of the OCMRs 542 and thus no signal, if any detected, at the MMRRFs is communicated or transmitted from the MMR-RFs to the OCMRCs 542 The technique of connection of the members of the set 532 and the members of the set 540 is explained hereinafter.

Figure 8:
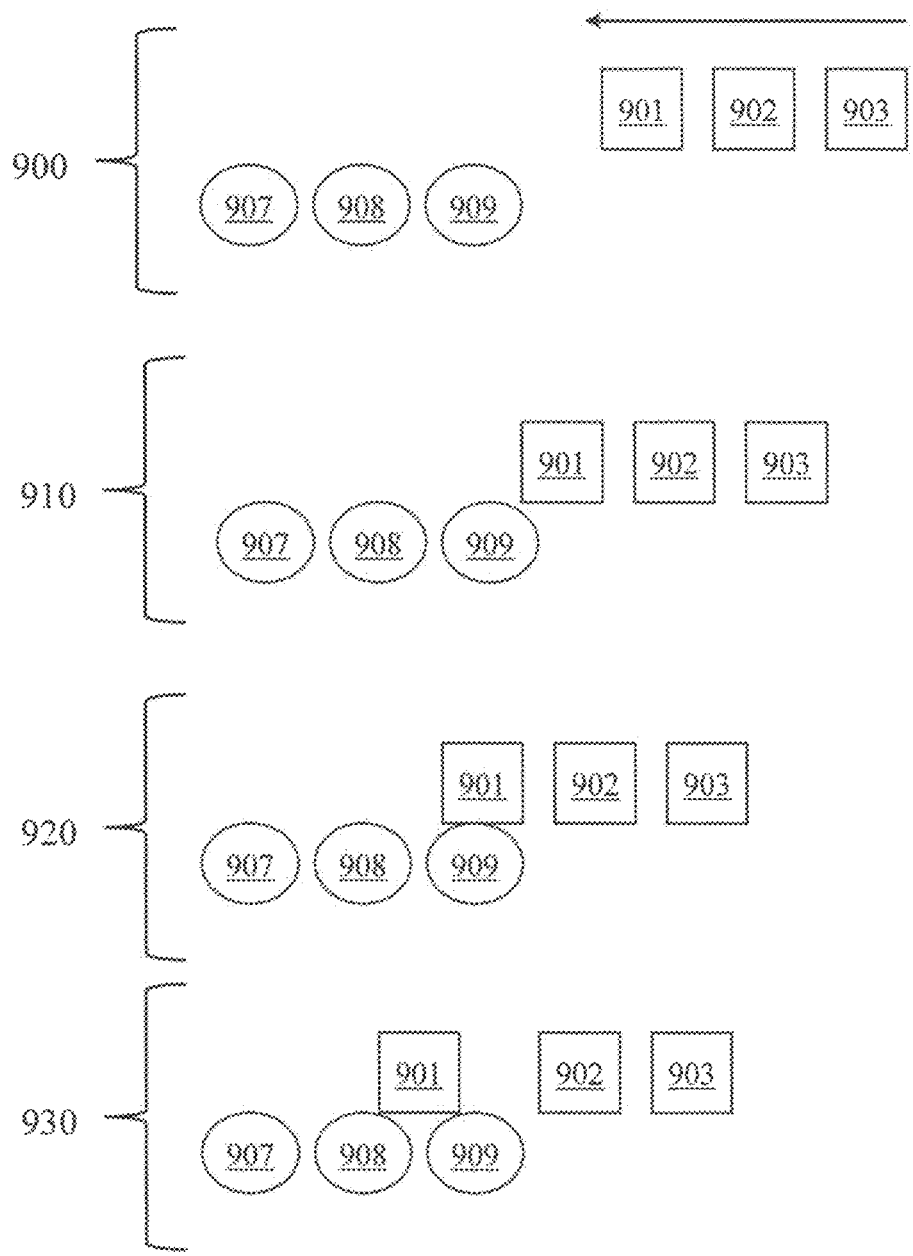
FIG. 8 illustrates a set of coil coupling elements and a set of apparatus coupling elements as the two sets move relative to each other.
Figure 9:
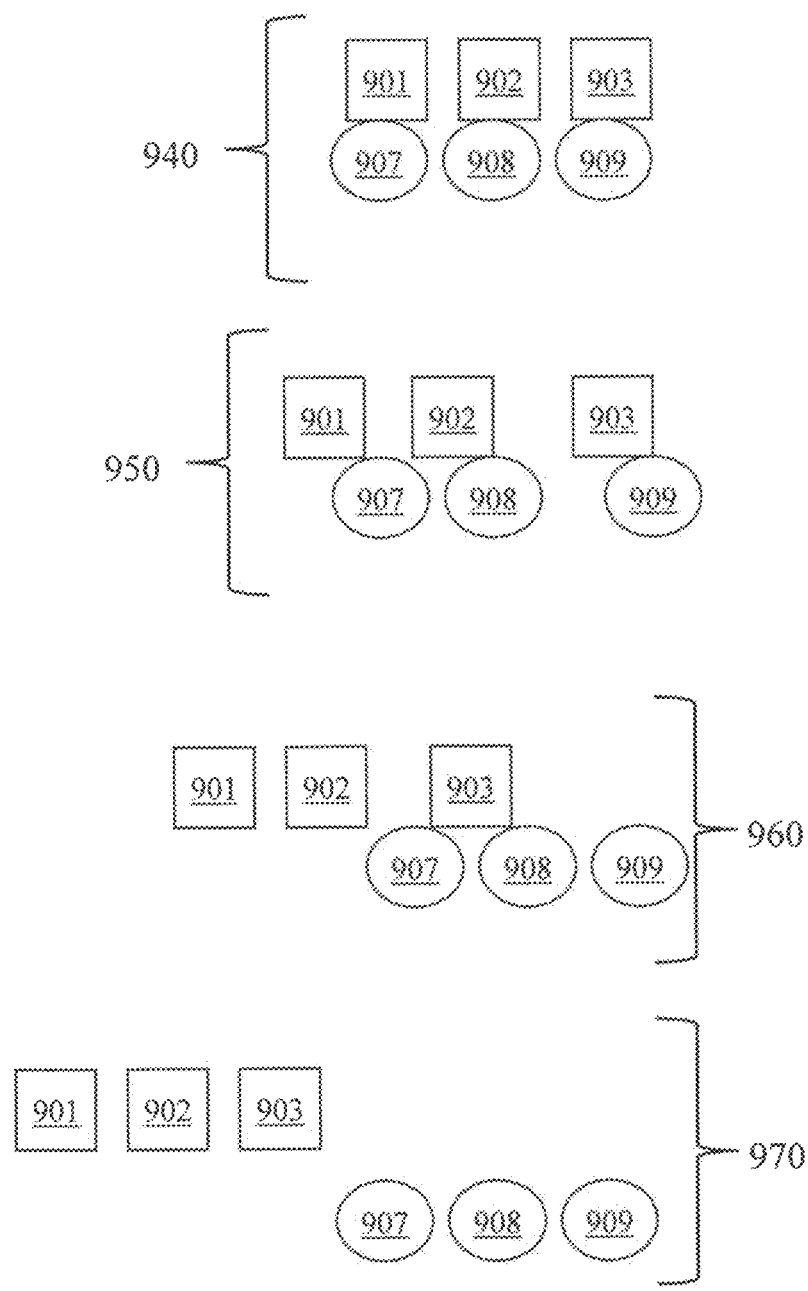
FIG. 9 illustrates a set of coil coupling elements and a set of apparatus coupling elements as the two sets move relative to each other.

FIGS. 8 and 9, in combination with FIG. 6, illustrate coil couplers or coil coupling elements 901, 902, and 903 which are members of the set 532, and are moveable relative to the OCCCs or the apparatus coupling elements 907, 908, and 909 of the set 540. In accordance with aspects of the present technique, the connection of the members of the set 532 and the members of the set 540 is carried out by establishing a capacitive contact between the members of the set 532 and the members of the set 540 by moving and aligning the members of the set 532 along the members of the set 540, as the members of the sets 532 and 540 are capacitive plates. Furthermore, at a given instance of time during the MR procedure, one of the OCCCs 907, 908, 909 can be in capacitive contact with at most one coil coupler 901, 902, 903 and one of the coil couplers 901, 902, 903 can be in capacitive contact with one or more OCCCs 907, 908, 909. It may be noted that when any coil coupler 901, 902, 903 is in capacitive contact with one or more selected OCCCs 907, 908, 909, the MR signal detected by the MMRRF coil associated with that coil coupler 901, 902, 903 is allowed to flow from the MMRRF coil to the one or more selected OCCCs 907, 908, 909 via the coil couplers 901, 902, 903 and the MR signal further flows from the one or more selected OCCCs 907, 908, 909 that is in contact with a given coil coupler 901, 902, 903 to one or more OCMRCs 542 associated with the one or more selected OCCCs 907, 908, 909. The coil coupler 901, 902, 903 and the OCCCs 907, 908, 909 are shaped in such a way and are orientated and spaced apart in such a way that when the coil coupler 901, 902, 903 are moving and are in capacitive contact with the one or more selected OCCCs 907, 908, 909, there is a constant capacitance maintained, during the movement of the coil coupler 901, 902, 903, between any given coil coupler 901, 902, 903 and the one or more selected OCCCs 907, 908, 909 to which the given coil coupler 901, 902, 903 is in capacitive contact with. Furthermore, the constant capacitance remains within a desired range for the MMRRF coil causing the MMRRF coil to remain tuned within a desired frequency range.

FIGS. 8 and 9 illustrate different instances of time during a MR procedure. In FIG. 8, at time 900, there is no overlap between any of the coil couplers 901, 902, 903 and apparatus coupling elements or the OCCCs 907, 908, 909. At time 910, coil coupling element or coil coupler 901 has just come in contact with apparatus coupling element or the OCCC 909. It may be noted that the term "contact" and "capacitive contact" have been used interchangeably hereinafter, and that the term "contact" means a capacitive contact between two entities such that a signal is allowed to flow between the two entities. At time 920, coil coupling element 901 is in full contact with apparatus coupling element or the OCCC 909. At time 930, coil coupling element 901 is in contact with apparatus coupling elements or two OCCCs 908 and 909. In FIG. 9, at time 940, each coil coupling element i.e. each coil coupler 901, 902, 903 is in contact with one distinct OCCC, namely 907, 908, 909, respectively. At time 950, each coil coupling element 901, 902, 903 is still in contact with one apparatus coupling element or OCCC 907, 908, 909. At time 960, only coil coupling element 903 is in contact with an apparatus coupling element i.e. with two OCCCs 907 and 908. At time 970, none of the coil coupling elements or the coil coupler 901, 902, 903 is in contact with any apparatus coupling elements or the OCCCs 907, 908, 909. Thus, at any given instance of time and/or at any relative position of the coil couplers 901, 902, 903 and the OCCCs 907, 908, 909, an apparatus coupling element or OCCC 907, 908, 909 may be in contact with zero or one coil coupler 901, 902, 903 or the coil coupling elements. However, at the same instance of time, a coil coupling element or coil coupler 901, 902, 903 may be in contact with zero, one, or more OCCCs 907, 908, 909.

It may be noted that if the coil coupling elements or coil couplers 901, 902, 903 and the apparatus coupling elements i.e. the OCCCs 907, 908, 909 are parallel capacitive plates and have regular shapes such as rectangular or circular shapes as has been illustrated in FIGS. 8 and 9, there would likely be variable capacitance at the coupling points i.e. for coil coupler 901, 902, 903, at the coupling points on OCCCs 907, 908, 909 for example for the coil coupler 901 the coupling points would be places where coil coupler 901 is in capacitive contact with the OCCCs 907, 908, 909. There would be variable capacitance at the coupling points due to the constantly varying surface area between the coupling elements i.e. coil coupler 901 and the OCCCs 907, 908, 909 as and when the different OCCCs come in capacitive contact with the coil coupler 901. The variable capacitance may result due to the movement of the coil coupler 901 relative to the OCCCs 907, 908, 909. Furthermore, there would be additional breaking point capacitance variations where the OCCCs 907, 908, 909 are separated i.e., in the gaps between the OCCCs 907, 908, 909.

Similarly, the plates described in the '556 and the '182 may produce variable capacitance due to constantly varying surface area between coupling elements. Recall that for parallel capacitive plates, capacitance (C) equals the surface area (A) of the plates divided by the distance (D) between the plates:

$$C = A/D$$

Example apparatus or systems of the present technique provide parallel capacitive plates having shapes and circuit designs that facilitate maintaining a constant capacitance taking into consideration the variation in capacitance between the coil coupler plates and apparatus coupler plates and also the variations due to the additional breaking point capacitances inside the apparatus coupler i.e. at the set 540. In the present technique, the capacitance is constant when the coil element or coil coupler 901 is at a position where the coil coupler 901 couples fully to one apparatus coupler or the OCCC for example as shown in FIG. 8 at time 920, or at any positions where the coil coupler 901 partially couples to two adjacent apparatus couplers i.e. OCCCs 909 and 908 as shown in FIG. 8 at time 930. Thus, the system of the present technique, therefore mitigates tuning or decoupling issues that arise when the capacitive coupling has varying capacity as in the '556 and '182.

Figure 10:
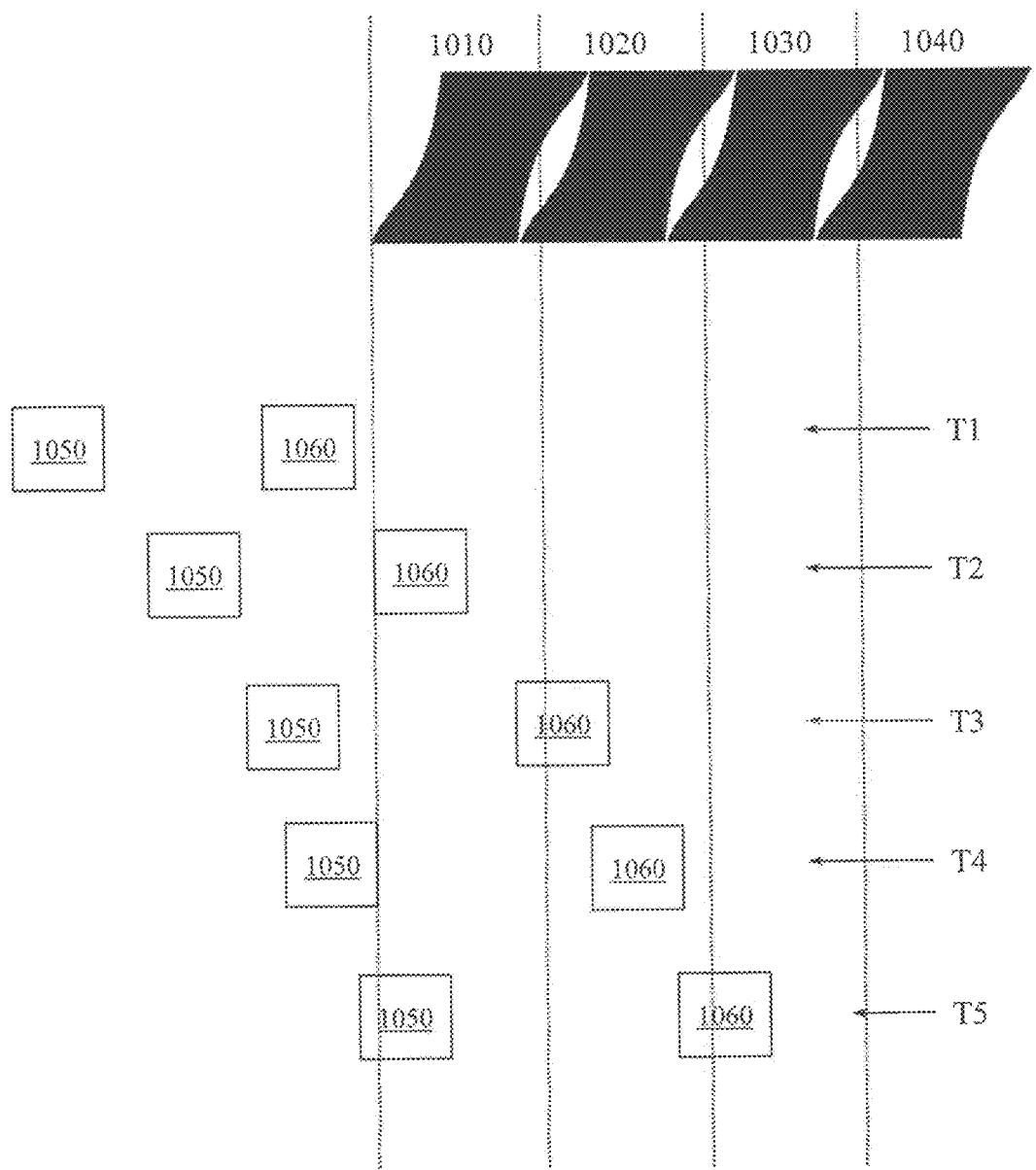
FIG. 10 illustrates a set of coil coupling elements and a set of apparatus coupling elements as the two sets move relative to each other.
Figure 11:
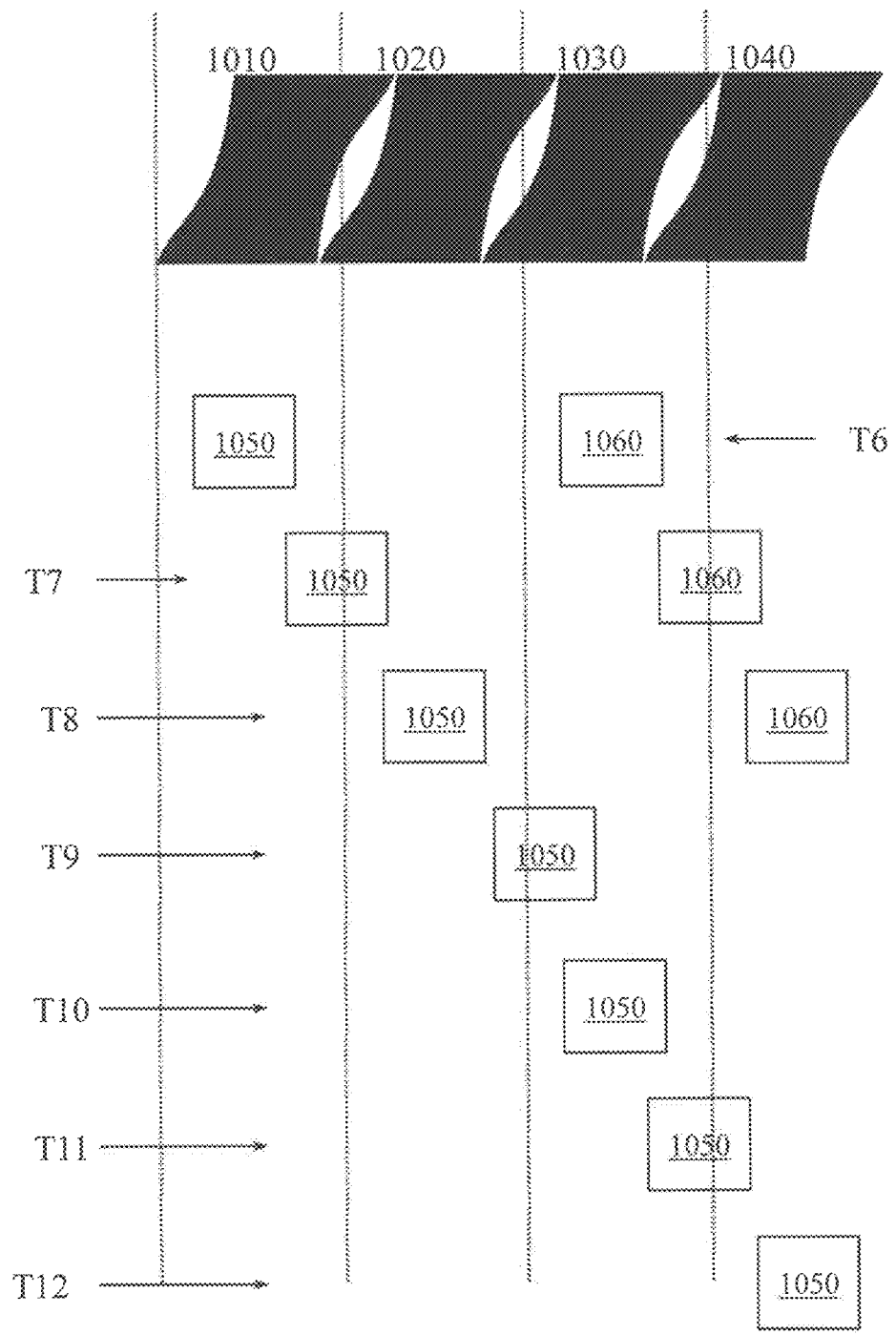
FIG. 11 illustrates a set of coil coupling elements and a set of apparatus coupling elements as the two sets move relative to each other.

FIGS. 10 and 11 illustrate apparatus coupling elements (also referred to as the OCCCs) 1010, 1020, 1030, and 1040 and coil coupling elements (also referred to as the coil couplers) 1050 an 1060. The apparatus coupling elements 1010-1040 and the coil coupling elements 1050-1060 may be moved relative to each other during an MR procedure as described in the '556 or '182. As illustrated in the FIGS. 10 and 11, and in accordance with aspects of the present technique, at any given time, an apparatus coupling element 1010-1040 may be in contact with zero or one coil coupling elements 1050, 1060. However, at any given time during the MR procedure, a coil coupling element 1050, 1060 may be in contact with zero, one, or two apparatus coupling elements 1010-1040. More generally, a coil coupling element 1050, 1060 may be in contact with N apparatus coupling elements 1010-1040, 'N' being an integer greater than or equal to zero.

In FIG. 10, which represents relative positions of the coil coupling element 1050, 1060 and the apparatus coupling elements 1010-1040 at different instances of time during the MR procedure, at time T1, none of the coil coupling elements 1050-1060 are in contact with any of the apparatus coupling elements 1010-1040. At time T2, the coil coupling element 1060 is in full contact with the apparatus coupling element 1010. At time T3, the coil coupling element 1060 is in contact with both the apparatus coupling element 1010 and the apparatus coupling element 1020, however, the coupling element 1050 is still not in contact with any of the apparatus coupling elements 1010-1040. At time T4, the coil coupling element 1060 is in full contact with the apparatus coupling element 1020. At time T5, the coil coupling element 1060 is contact with both the apparatus coupling element 1020 and the apparatus coupling element 1030. Also, the coil coupling element 1050 is in contact with the apparatus coupling element 1010.

In FIG. 11, at time T6, the coil coupling element 1060 is in full contact with the apparatus coupling element 1030 and the coil coupling element 1050 is in full contact with the apparatus coupling element 1010. At time T7, the coil coupling element 1060 is in contact with the apparatus coupling elements 1030 and 1040, and the coil coupling element 1060 is contact with the apparatus coupling elements 1010 and 1020. At time T8, the coil coupling element 1060 is in full contact with the apparatus coupling element 1040 and the coil coupling element 1050 is in full contact with the apparatus coupling element 1020. It may be noted that in one embodiment, the entire spatial region represented by the OCCCs of the system of the present technique i.e. for example say the apparatus coupling elements 1010-1040 represents the excitation zone 520 (as shown in FIG. 5). In another embodiment, a part of the entire spatial region represented by the OCCCs of the system of the present technique represents the excitation zone 520.

At time T9, the coil coupling element 1060 is not illustrated because it has moved out of the excitation zone (not shown in FIG. 9) associated with the apparatus coupling elements 1010-1040 and is not in contact with any of the apparatus coupling elements 1010-1040. It may be noted that in one of the embodiments of the present technique, the OCCCs are located in the excitation zone or in other words the OCCCs form or mark or create the excitation zone, whereas the coil couplers move into and out of the excitation zone during the MR procedure. At time T9, the coil coupling element 1050 is in contact with the apparatus coupling elements 1020 and 1030. At time T10, the coil coupling element 1050 is in contact with the apparatus coupling element 1030. At time T11, the coil coupling element 1050 is in contact with the apparatus coupling elements 1030 and 1040. At time T12, the coil coupling element 1050 is in contact with the apparatus coupling element 1040.

As illustrated in FIGS. 10 and 11, the coil coupling elements 1050-1060 and the apparatus coupling elements 1010-1040 move relative to each other. The shapes of the coil couplers 1050, 1060 and/or of the OCCCs 1010-1040 illustrated in FIGS. 10 and 11, and other shapes of the coil couplers and/or the OCCCs that are designed or fabricated according to the design of fabrication criteria outlined below, maintain a constant capacitance during the relative movement of the capacitance plates forming the OCCCs and the coil couplers. The coil couplers therefore maintain a constant capacitance for an RF coil i.e. the MMRRF coil (as shown in FIGS. 5 and 6) that is coupled to off coil elements i.e. the OCMRC, using capacitive plates i.e. coil couplers and the OCCCs, having the illustrated shapes and that produce a combined capacitance of the illustrated breaking point capacitance at non-decoupling points, the capacitance at decoupling points, and the coupling capacitance between the coil couplers and the apparatus couplers.

A part of the total capacitance for the coil i.e. the MMRRF coil associated with plate 1060 i.e. the coil coupler 1060 may come from an interaction with one of the plates 1010-1040 i.e. the OCCCs 1010-1040 and another part of the total capacitance for the coil i.e. the MMRRF coil associated with the plate 1060 i.e. the coil coupler 1060 may come from an interaction with a different member of the plates 1010-1040 i.e. the OCCCs 1010-1040. As the plate 1060 moves along the plate 1010 to 1040, the contribution to the total capacitance from the different plates 1010 to 1040 changes. Carefully selecting the shapes and circuit designs of the plate 1060 and the plates 1010-1040 facilitates maintaining a constant capacitance for the MMRRF coil associated with the plate 1060. The equations described below explain design criteria for selecting shapes for the coil coupling elements i.e. the coil couplers and the apparatus coupling elements i.e. the OCCCs.

Figure 12:
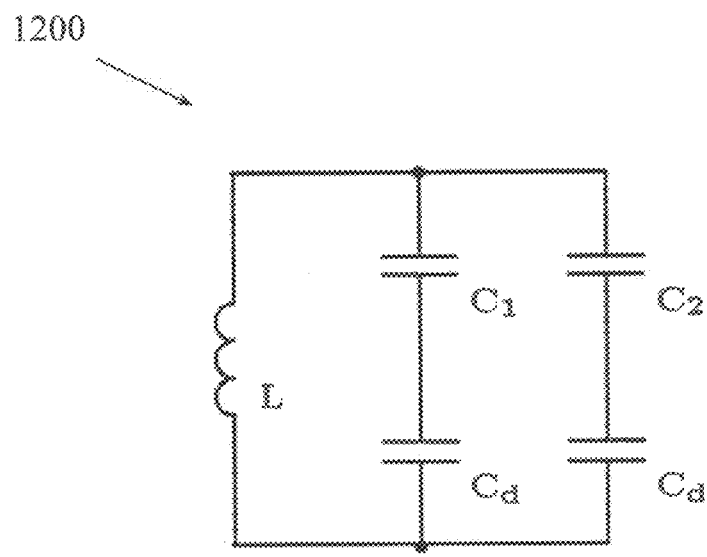
FIG. 12 illustrates a circuit.

FIG. 12 illustrates an RF receive coil equivalent circuit 1200 with coupling capacitances $C_1$, $C_2$ and detuned receiver input capacitance $C_d$. Such an equivalent circuit 1200 may be associated with a certain RF coil i.e. the MR coils where some elements are located physically on the MR coil for example a loop of the MR coil that can detect the MR signals and some elements are located physically off the MR coil. The on coil elements for example the loop of the MR coil, mentioned above as the MMRRF coil, are connected to the off coil elements for example the OCMRC by capacitive plates which are the coil couplers and the OCCCs, in the present technique. The MR coil may have a coil capacitive plate i.e. the coil coupler and the off coil apparatus may have an off coil capacitive plate i.e. the OCCCs. Example apparatus or systems of the present technique provide capacitive coupler plates i.e. the coil couplers for MRI receive coils and corresponding apparatus couplers i.e. the OCCC that move relative to each other so that the total capacitance seen by the MMRRF coil or the RF coil (e.g., the series connection of the coupler capacitances and the constant receiver input capacitances $C_d$) is constant independent of the relative plate positions. With receive channel input capacitance in detuned state $C_d$ and maximum coupler series capacitance $C_c$ the total capacitance seen by the RF coil in the case of one receiver per coil is:

$$C_T = \frac{C_c C_d}{C_c + C_d}. \tag{1}$$

Connecting one RF coil onto two receive channels with blending weights α, 1α where α is [0, 1] requires coupler capacitances $C_1(\alpha)$, $C_2(\alpha)$ into the two receiver inputs to be:

$$\frac{C_1 C_d}{C_1 + C_d} = \alpha \frac{C_c C_d}{C_c + C_d}. \tag{2}$$

Example RF coils are minimalist coils i.e. the MMRRF coils that have some circuit elements located off the coil. Example RF coils have capacitive coupler plates. Example apparatus have apparatus capacitive coupler plates to electrically connect the RF coils to the circuit elements that are located off the coil. The RF coil capacitive coupler plates and the apparatus capacitive coupler plates move relative to each other, which produces different circuit schemes.

Figure 13:
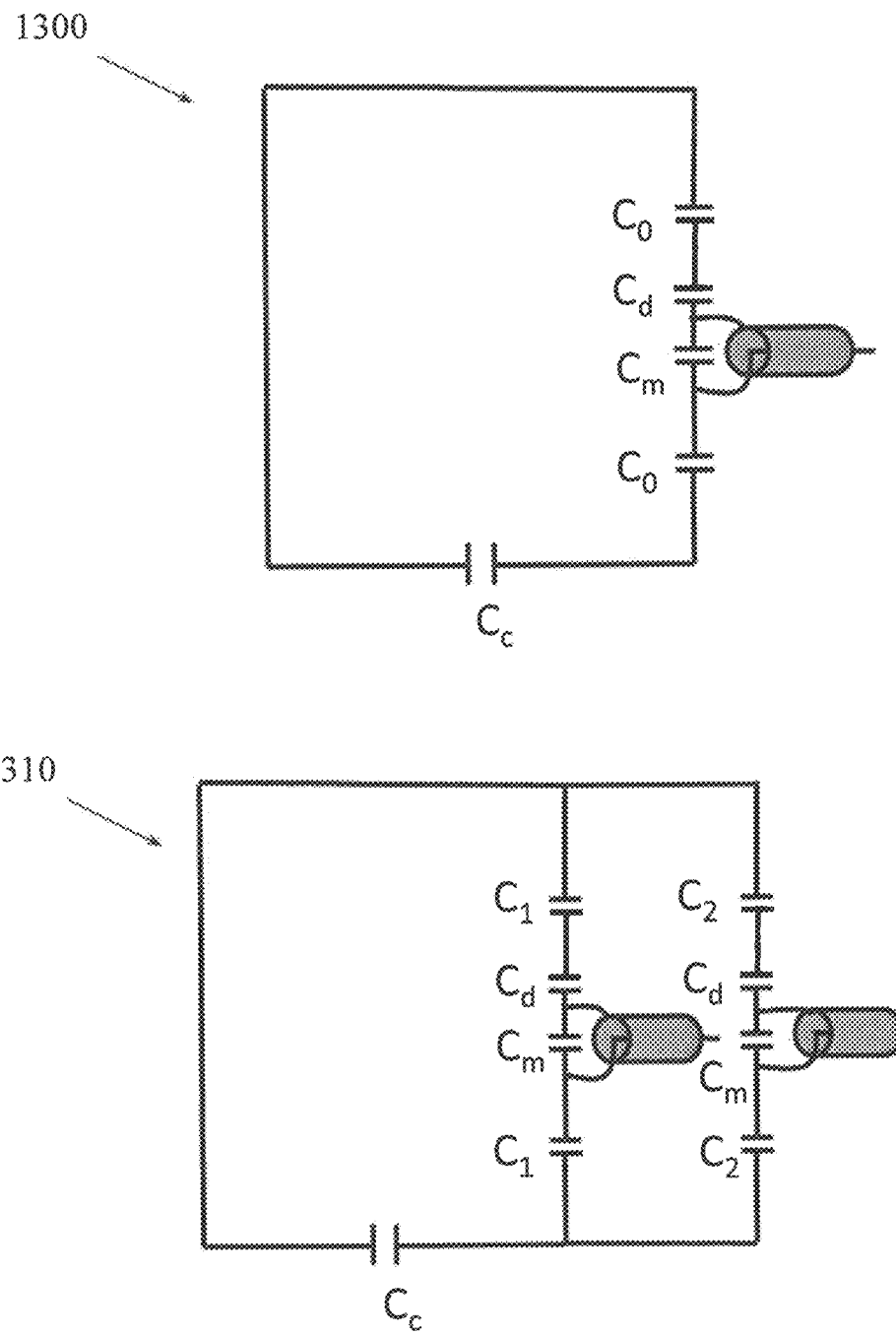
FIG. 13 illustrates two circuits.

FIG. 13 illustrates two example circuit schemes. Scheme 1300 illustrates one coil coupled to one receive channel. Scheme 1310 illustrates one coil coupled to two receive channels. $C_c$ is the tuning capacitor on the coil element. $C_m$ is the matching capacitor, which may be in the region of [50 pF, 100 pF]. $C_d$ is the capacitor on the decoupling board. For 1.5 T coils, $C_d$ may be composed of a constant 39 pF capacitor and a small tuning capacitor. For the 1300 scenario of one coil coupled to one receive channel, the coupling capacitor is a constant and is at the maximum value $C_0$. When the coil is coupled to two receive channels as in 1310, $C_1$ and $C_2$ represent the coupling capacitance of the coupling capacitors. Cd may be the equivalent total break point capacitance produced by decoupling capacitors. When a coil is coupled to one receive channel as illustrated in 1300, Cd may be a result of a first set of capacitors. When a coil is coupled to two receive channels as illustrated in 1310, $C_d$ may be a result of a second, different set of capacitors.

In order to keep a constant sensitivity, the working frequencies in scheme 1300 and scheme 1310 should be the same, which requires the total capacitance excluding $C_m$ and $C_c$ in the circuit to be the same:

$$\frac{C_1 C_d}{C_1 + 2C_d} + \frac{C_2 C_d}{C_2 + 2C_d} = \frac{C_0 C_d}{C_0 + 2C_d} \tag{3}$$

One conclusion observed by examining Equation (3) is that $C_1 + C_2 \neq \text{const}$. Otherwise, when $C_1 = C_2 = C_0/2$, it requires:

$$\frac{C_0 C_d}{\frac{C_0}{2} + 2C_d} = \frac{C_0 C_d}{C_0 + 2C_d}$$

which can only be satisfied when $C_1 = 0$ or $C_0 = 0$, which will not work in the intended MR applications where a receive coil may be connected to one or more channels.

Example apparatus seek to have constant capacitance for a coil. Therefore, assuming $C_1$ is given, $C_2$ can be derived as a function of $C_1$ according to Equation (3) by:

$$C_2 = 2C_d \cdot \left( \frac{1}{1 + \frac{2C_d}{C_0 + 2C_d} - \frac{2C_d}{C_1 + 2C_d}} - 1 \right) \tag{4}$$

Figure 14:
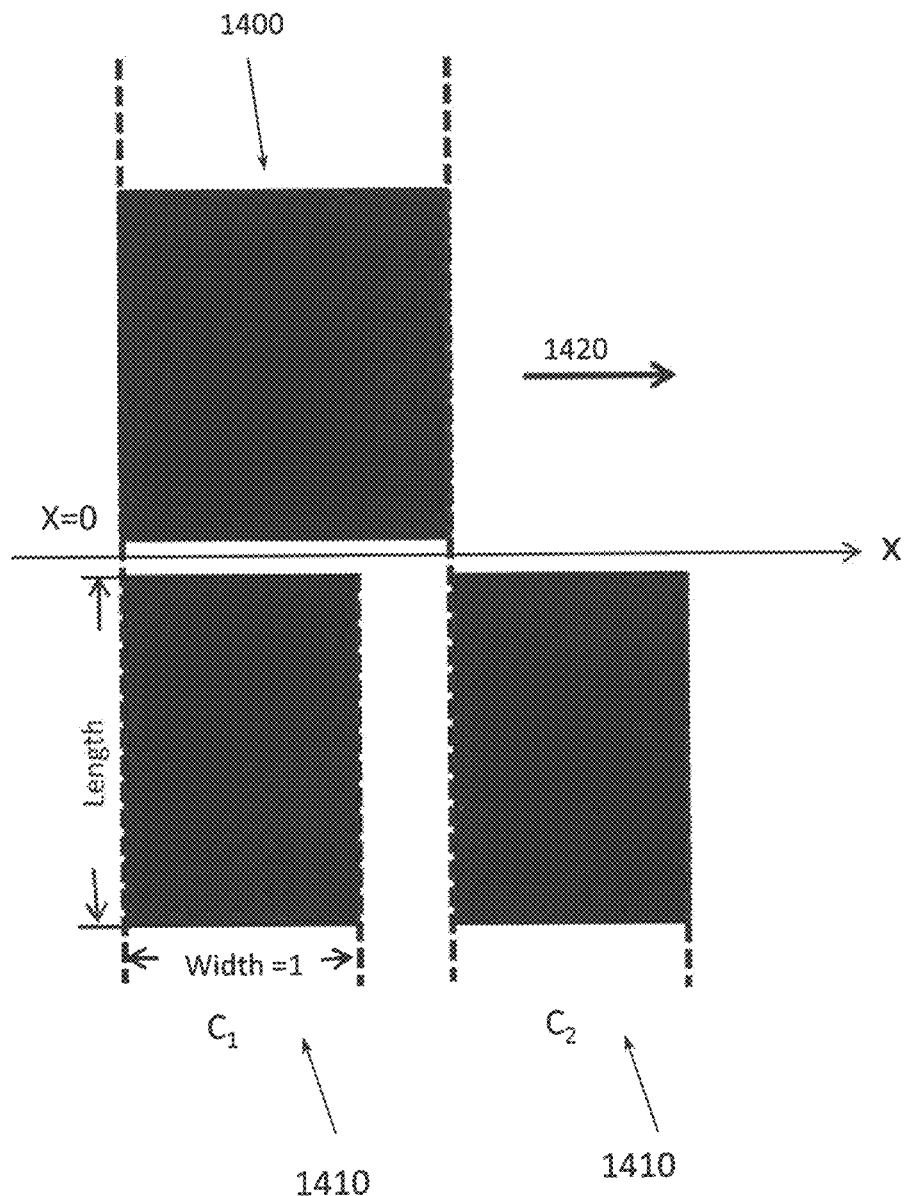
FIG. 14 illustrates an MR coil coupler and an apparatus coupler.

As a simplified case, FIG. 14 shows a one-coil two-receive-channel apparatus having square and rectangular plates. The receive plates 1410 are fixed and the coil plate 1400 can move along the x-direction 1420. The coil plate 1400 is the coupler for the minimalist coil. The receive plates 1410 are the couplers for off coil circuitry. In this embodiment, $C_1$ and $C_2$ can be written as functions of x: $C_1(x)$ and $C_2(x)$, respectively. Additionally, $C_1(x)$ and $C_2(x)$ are assumed to depend only on the length of the capacitor plate. The length of $C_2(x)$, denoted as $L_2(x)$, can then be written as $$L_2(x) = 4C_d^2 \cdot \frac{1}{\left(1 + \frac{2C_d}{C_0 + 2C_d} - \frac{2C_d}{C_1(x) + 2C_d}\right)^2} \cdot \frac{1}{(C_1(x) + 2C_d)^2} \cdot \left(-\frac{\partial C_1(x)}{\partial x}\right) \tag{5}$$

In this example, the width of the capacitor plate $C_1$ is normalized to 1. The x=0 position is defined as the place where the far left edge of the coil plate aligns with the far left point of the $C_1$ plate. Thus, the width of $C_2$ is also 1 and the region of interest is $x \in [0,1]$.

According to Equations (4) and (5), prior-knowledge of $C_1(x)$ or $C_2(x)$ is needed to solve for $L_2(x)$ or $L_1(x)$. Different cases for $C_1(x)$ are examined below. A simple case exists for $C_1(x)$ when $L1(x)=A$, $x \in [0,1]$, where A is a constant. In this case $C_1(x)$ can be written as:

$$C_1(x) = (1-x) \cdot C_0 \tag{6}$$

Figure 15:
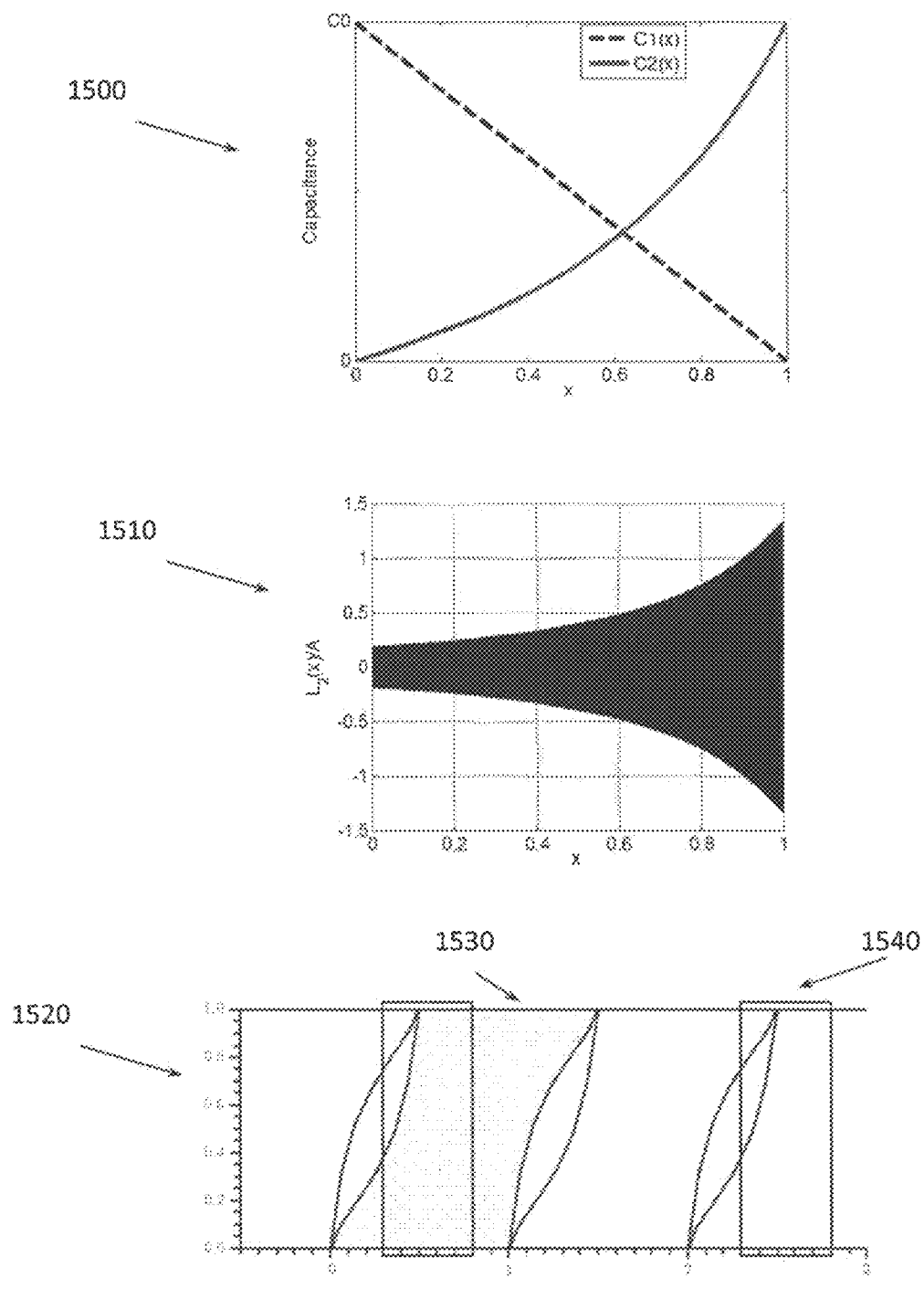
FIG. 15 illustrates data associated with one example receive plate design.

Substituting Equation (6) into Equation (4) and (5), provides $C_2(x)$ and $L_2(x)$, which are plotted in FIG. 15. 1500 is a plot for $C_2(x)$ and 1510 is a plot for $L_2(x)$. FIG. 15 illustrates one example receive plate design for:

$$C_1(x) = (1-x) \cdot C_0$$

There are a large, potentially practically infinite number of shapes that may satisfy the plate design. For example, plot 1520 illustrates fin shaped plates 1530 and rectangular shaped plates 1540. One apparent problem with having a square plate C1 is that the maximum length for plate C2 is about three times the maximum length of plate C1. In one embodiment, the length of plate C1 may be reduced faster according to, for example:

$$L_1(x) = A(1-x), x \in [0,1].$$

In this embodiment, $C_1(x)$ may then written as:

$$C_1(x) = (1-x)^2 \cdot C_0 \tag{7}$$

Figure 16:
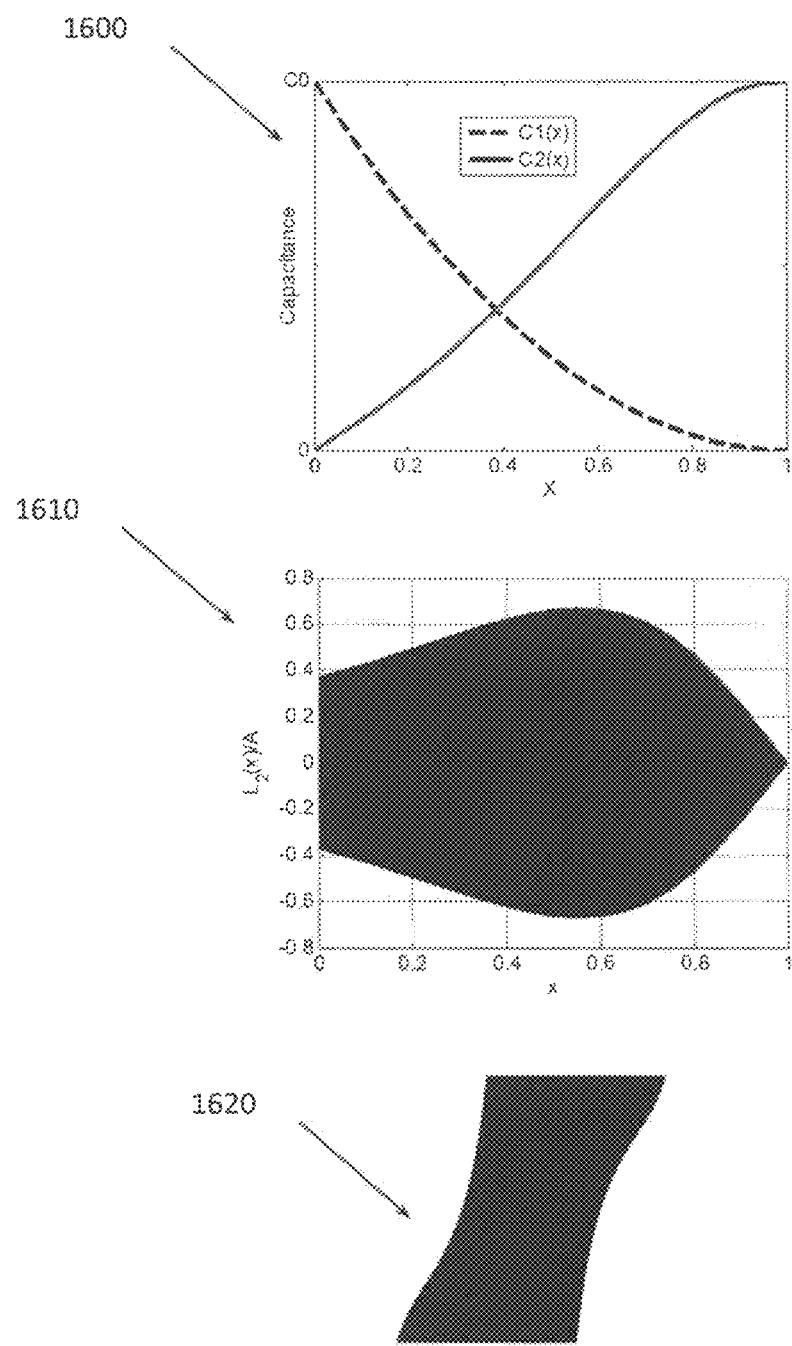
FIG. 16 illustrates data associated with one example receive plate design.

FIG. 16 illustrates the corresponding $C_2(x)$ and $L_2(x)$. 1600 is a plot for $C_2(x)$ and 1610 is a plot for $L_2(x)$. Fin shaped plate 1620 is an example coupler plate design that satisfies the design criteria and exhibits $C_2(x)$ and $L_2(x)$.

Equation (4) only gives one unit, or one period, of the capacitor plates on the receive side. When the coil plate moves, $C_2$ becomes $C_1'$ and a new design $C_2'$ is needed to compensate for the capacitance change in $C_1'$. If $C_1$ and $C_2$ in Equation (3) are substituted with $C_2$ and $C_2'$ respectively, it reaches $$\frac{C_2 C_d}{C_2 + 2C_d} + \frac{C_2' C_d}{C_2' + 2C_d} = \frac{C_0 C_d}{C_0 + 2C_d} \tag{8}$$

Due to the symmetry of C1 and C2 in Equation (1), a solution to Equation (8) is:

$$C_2' = C_1 \tag{9}$$

Figure 17:
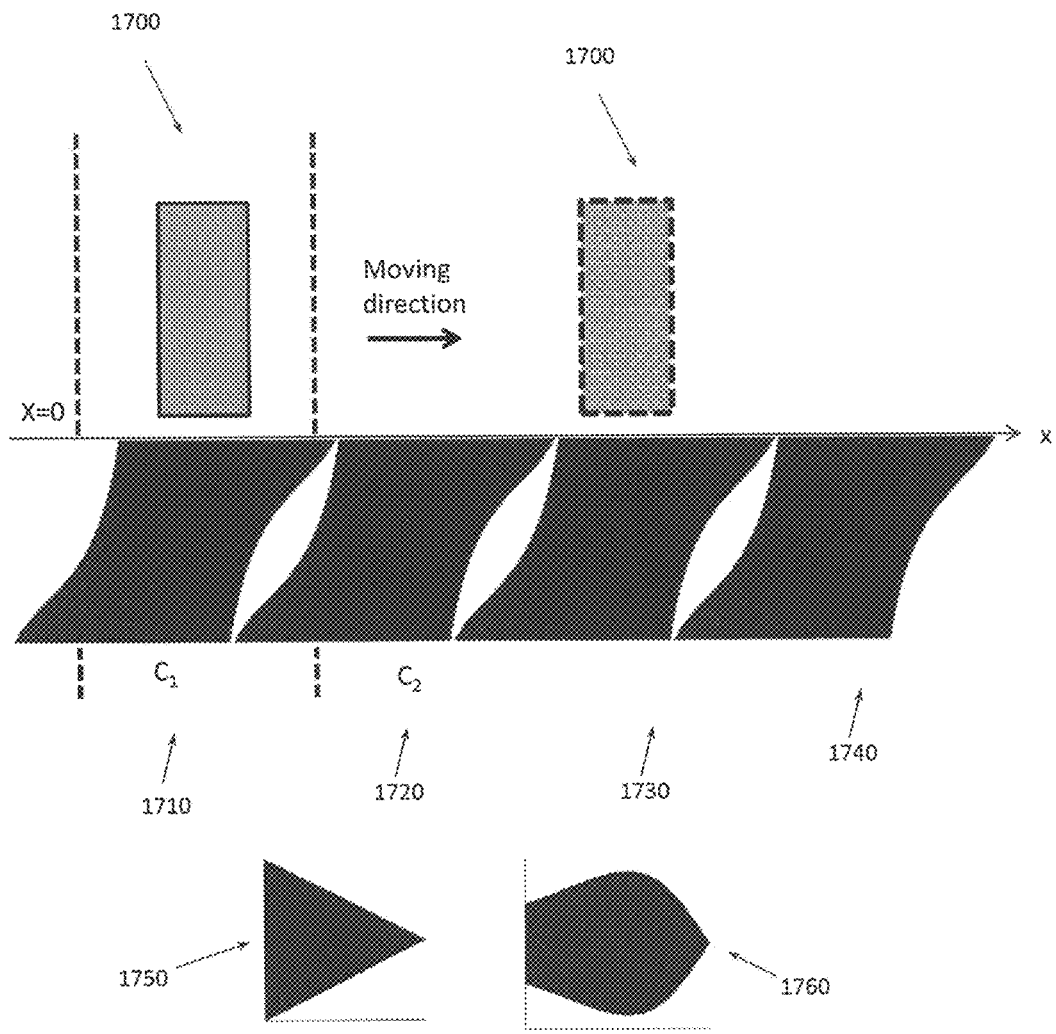
FIG. 17 illustrates an MR coil coupler and a set of example apparatus couplers.

Following the same logic, the capacitor plates on the receive plate may be a repetition of the C1, C2 unit. The results for this second case and the discussion above prove that one design for the capacitor plates used in the coil coupler element and on the apparatus coupler element are shown in FIG. 17. A coil plate 1700 is illustrated as being square and moving from left to right. The Coil plate 1700 is the coil coupler element or the coil coupler. There are four apparatus plates 1710, 1720, 1730, and 1740. The Apparatus plates 1710 and 1730 correspond to C1 and the apparatus plates 1720 and 1740 correspond to C2. Each of the apparatus plate is the OCCC. The shapes illustrated in FIG. 17 are one example of the shapes for the coil coupler elements (e.g., 1700) and the apparatus coupler elements (e.g., the receive plates 1710-1740 which are the OCCCs) that can be used to maintain constant capacitance and thus to mitigate issues with tuning and decoupling that may appear in other designs.

The plates 1710-1740 are referred to herein as having a "fin" shape. The plate 1750 and the shape 1510 are referred to herein as having a "triangular" shape. The plate 1760 and the shape 1610 are referred to herein as having a "spade" shape. More generally, the plate 1750 has a "polygonal" shape while the plate 1760 has a "non-polygonal" shape. The relationships between C1 and C2 for these shapes are described by equations 7-9. Multiple different shapes that maintain the relationships for C1 and C2 described in equations 7-9 may be employed.

Figure 18:
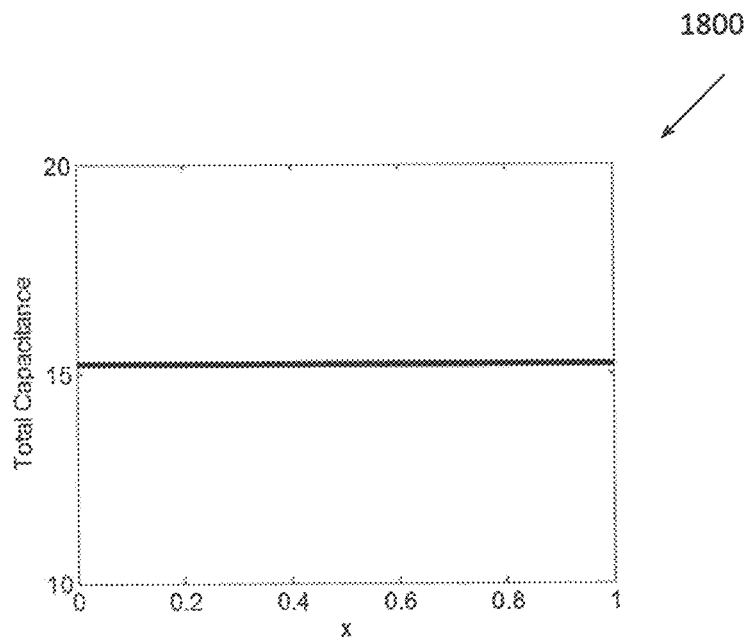
FIG. 18 illustrates data associated with an MR coil coupler and a set of example apparatus couplers.

FIG. 18 illustrates a plot 1800 of the total impedance produced using the shapes illustrated in FIG. 17. Recall that the shapes illustrated in FIG. 17 were produced in accordance with the design criteria described above. In one embodiment, the plates 1710 and 1740 may be dummy plates that are positioned at an entry area and an exit area. A coil coupler will start to transmit signals when it starts to enter an active zone i.e. the excitation zone. However, when the coil coupler has just entered the active zone, the combined capacitance may not have risen to the desired constant capacitance. The desired combined capacitance may not be achieved until the coil i.e. the MMRRF coil or the MR coil is fully coupled to the first plate at the entry zone i.e. a region at the beginning of the excitation zone and inside the excitation zone starting from the point of entry of the coil towards the travel direction of the coil in the excitation zone. Similarly, when the coil is leaving the active zone the combined capacitance may drop off after the coil is no longer fully coupled with the last active plate at the exit zone i.e. a region at the end of the excitation zone and inside the excitation zone starting from the point of exit of the coil towards a direction opposite to the travel direction of the coil in the excitation zone. Thus, the plates 1710 and 1740 may be added as dummy plates that facilitate achieving the desired combined capacitance before the coil enters the active zone.

Figure 7:
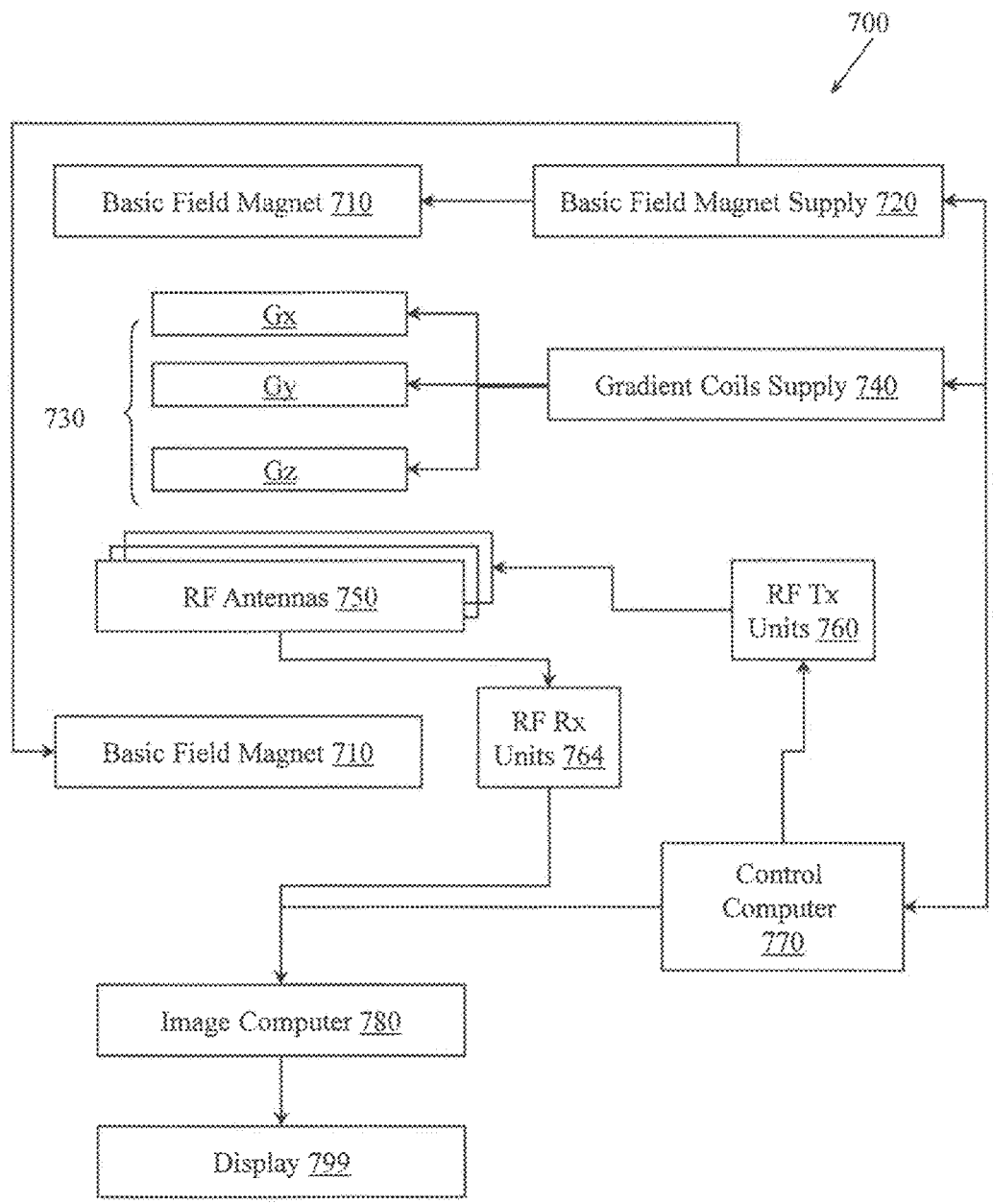
FIG. 7 illustrates an MRI apparatus configured with an example MRI RF coil with coupling elements that produce a constant capacitance.

FIG. 7 illustrates an example MRI apparatus 700 configured with a set of example minimalist RF coils that are connectable to RF receive units 764 with constant capacitance coupling. The apparatus 700 includes a basic field magnet(s) 710 and a basic field magnet supply 720. Ideally, the basic field magnets 710 would produce a uniform B0 field. However, in practice, the B0 field may not be uniform, and may vary over an object being imaged by the MRI apparatus 700. MRI apparatus 700 may include gradient coils 730 configured to emit gradient magnetic fields like $G_S$, $G_P$ and $G_R$. The gradient coils 730 may be controlled, at least in part, by a gradient coils supply 740. In some examples, the timing, strength, and orientation of the gradient magnetic fields may be controlled and thus selectively adapted during an MRI procedure.

The MRI apparatus 700 may include a set of RF antennas 750 that are configured to generate RF pulses and to receive resulting magnetic resonance signals from an object or examination subject to which the RF pulses are directed. The RF antennas 750 may be controlled, at least in part, by a set of RF transmission units 760. An RF transmission unit 760 may provide a signal to a member of the set of RF antennas 750. In one embodiment, members of the set of RF antennas 750 may employ constant capacitance couplers like the RF coils described herein.

The gradient coils supply 740 and the RF transmission units 760 may be controlled, at least in part, by a control computer 770. The magnetic resonance signals received from the RF antennas 750 can be employed to generate an image, and thus may be subject to a transformation process like a two dimensional FFT that generates pixilated image data. The transformation can be performed by an image computer 780 or other similar processing device. The image data may then be shown on a display 799. While FIG. 7 illustrates an example MRI apparatus 700 that includes various components connected in various ways, it is to be appreciated that other MRI apparatus may include other components connected in other ways. In one example, MRI apparatus 700 may include control computer 770. In one example, a member of the set of RF antennas 750 may be individually controllable by the control computer 770.

The MRI apparatus 700 may be configured with minimalist MR RF coils, off coil MR circuits, and other components as described below. For example, MRI apparatus 700 may interact with a system that includes a coil coupler electrically connected to a minimalist magnetic resonance radio frequency (MMRRF) coil and a plurality of off coil circuitry couplers (OCCCs) that are electrically connected to a corresponding plurality of off coil MR circuits in a one-to-one manner. Both the coil coupler and an off coil circuitry coupler may be capacitive plates.

Figure 19:
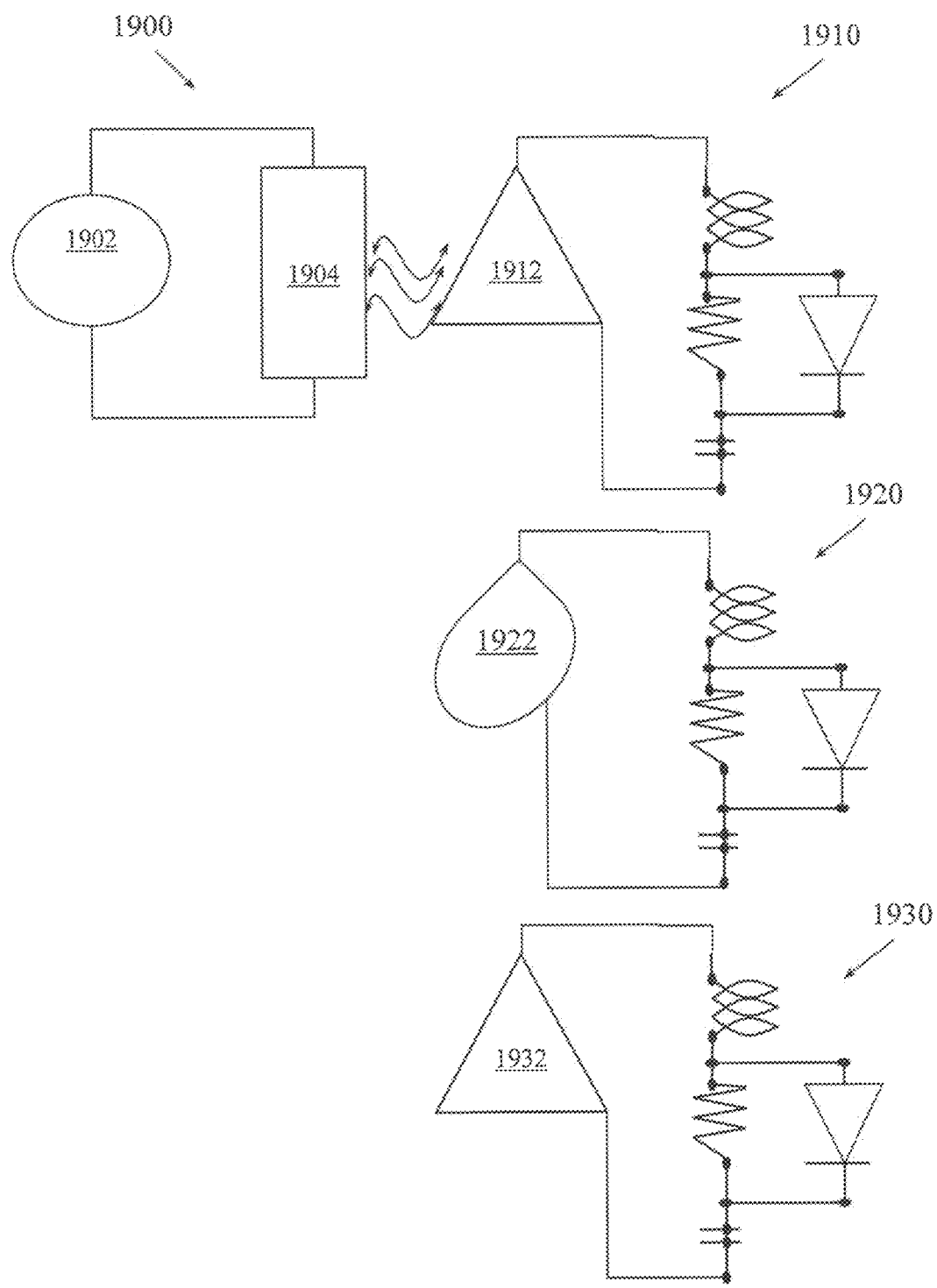
FIG. 19 illustrates a minimalist MR RF coil and a plurality of off coil circuits that are connectable to the minimalist MR RF coil via a circuit connector.

FIG. 19 illustrates an MMRRF coil 1900, or simple the coil 1900, that includes a loop 1902 and coil connector 1904. FIG. 19 also illustrates a plurality of off coil circuits (e.g., 1910, 1920, 1930) that are connectable to coil connector 1904 by circuit connectors 1912, 1922, and 1932 i.e. the OCCCs. It may be noted herein that 'connectable' or 'connected' is used in reference to capacitive connections. The off coil circuits i.e. the OCMRC have elements that may traditionally have been located on the coil 1900. From the FIG. 19 a movement of the coil 1900 with respect to the OCCCs may be visualized. The coil 1900 for example may move from a position where the coil coupler 1904 is contact with the OCCC 1912 to another position where the coil coupler 1904 is in contact with both the OCCCs 1912 and 1922 to yet another position where the where the coil coupler 1904 is contact with only the OCCC 1922, and so on and so forth. As the coil 1900 moves, the coil connector 1904 will come in contact with connectors 1912, 1922, and 1932 in turn. The systems of the present technique facilitate maintaining a constant capacitance for the coil 1900. The constant capacitance may be the equivalent total capacitance of breaking point capacitances at non-decoupling points, capacitances at coupling points, and coupling capacitances between the coil couplers and the apparatus couplers. In one embodiment, the constant capacitance is the sum of the capacitance between the coil coupler plate and the apparatus coupler plates and additional breaking point capacitance inside the apparatus coupler.

In one embodiment, the coil coupler (e.g., 1904) is moveable relative to the plurality of OCCCs (e.g., 1912, 1922, 1932) by the apparatus 700 during an MR procedure. The coil coupler 1904 and the plurality of OCCCs 1912, 1922, 1932 are arranged so that the coil coupler 1904 will come in capacitive contact with N OCCCs at a time as it moves during the MR procedure, N being an integer greater than or equal to zero. While the coil 1904 may contact more than one OCCC 1912, 1922, 1932 at any time, one OCCC 1912, 1922, 1932 can only be in capacitive contact with at most one coil coupler 1904 at any time.

At the time during which the coil coupler 1904 is in capacitive contact with one of the OCCCs 1912, 1922, 1932, the coil coupler 1904 will be disposed parallel to the OCCCs 1912, 1922, 1932. When the coil coupler 1904 is in capacitive contact with one of the OCCCs 1912, 1922, 1932, the MMRRF coil associated with the coil coupler 1904 will be connected to the OCMRC. Being connected to the OCMRC allows MR signals detected by the MMRRF coil 1904 to flow from the MMRRF coil 1904 to the off coil MR circuit. The MR signals may then be processed by the apparatus 700.

In the present technique, as the coil coupler 1904 moves relative to the plurality of OCCCs 1912, 1922, 1932, the coil coupler 1904 comes in contact with different OCCCs 1912, 1922, 1932 and with different numbers of OCCCs i.e. with no OCCC or with one OCCC only or with two OCCCs, as illustrated, for example, in FIGS. 8-11. When the coil coupler 1904 is in capacitive contact with one or more OCCCs 1912, 1922, 1932 and while the coil coupler 1904 is moving relative to the plurality of OCCCs 1912, 1922, 1932, the system is configured so that there is a constant capacitance between the coil coupler 1904v and the one or more OCCCs 1912, 1922, 1932 with which the coil coupler 1904 is in capacitive contact. Maintaining the constant capacitance produces a capacitance that remains within a desired range for the MMRRF coil 1904 which in turn causes the MMRRF coil 1904 to remain tuned to within a desired frequency range. This improves the present technique over conventional systems where constant capacitance may not be maintained because, for example, constant surface area is not maintained.

Recall that the capacitance for an MMRRF coil for example the MMRRF coil 1904, is described by:

$$\frac{C_1 C_d}{C_1 + 2C_d} + \frac{C_2 C_d}{C_2 + 2C_d} = \frac{C_0 C_d}{C_0 + 2C_d}$$

where:

$C_d$ is the equivalent total break point capacitance produced by a decoupling circuit on a member of the plurality of off coil MR circuits, $C_0$ is the capacitance produced during a capacitive coupling between the coil coupler and a single OCCC when the coil coupler is in capacitive connection with the single OCCC, $C_1$ is the capacitance produced by a first capacitive coupling between the coil coupler and a first OCCC when the coil coupler is in capacitive connection with the first OCCC and a second OCCC, where $C_1$ is a function of the shape of the first OCCC, and $C_2$ is the capacitance produced by a second capacitive coupling between the coil coupler and the second OCCC when the coil coupler is in capacitive connection with the first OCCC and the second OCCC, where $C_2$ is a function of the shape of the second OCCC.

Given this relationship between $C_0$, $C_1$, and $C_2$, when the value for $C_1$ is known, $C_2$ is defined by:

$$C_2 = 2C_d \cdot \left( \frac{1}{1 + \frac{2C_d}{C_0 + 2C_d} - \frac{2C_d}{C_1 + 2C_d}} - 1 \right).$$

In one embodiment the constant capacitance is achieved, at least in part, by the shapes of the various couplers e.g. the coil couplers and the OCCCs. In one example, the shape of the first OCCC is a function of the shape of the coil coupler and the second OCCC. Similarly, the shape of the second OCCC is a function of the shape of the coil coupler and the first OCCC. The shapes may include, for example, fin shapes, triangular shapes, spade shapes, polygonal shapes, and non-polygonal shapes. While the first and second OCCC are described, a greater number of OCCC may be employed. Similarly, while a fixed shape for the coil coupler and variable shapes for the OCCCs are described, the OCCCs may have fixed shapes and the coil couplers may have variable shapes.

In one embodiment, the plurality of the OCCCs is arranged in a repeating pattern of alternating triangular shapes and spade shapes. In another embodiment, the plurality of the OCCCs is arranged in a repeating pattern of alternating polygonal shapes and non-polygonal shapes.

The MR apparatus 700 may be part of system that moves a patient or the examination subject through the excitation zone during the MR procedure. The system may include two or more MR coils i.e. MMRRF coils. Each MR coil may include a loop and a coil connector. The two or more MR coils are moved through the excitation zone during the MR procedure by the MR apparatus 700. At least one of the MR coils will acquire MR signals while in the excitation zone. The system may also include two or more MR coil circuits i.e. OCMRCs. Each MR coil circuit may include a signal processing circuit, also referred to as a signal processor or a signal processing unit or an evaluation device which is configured to receive the MR signals and to process the received signals or to store or to transmit the received signals and a circuit connector, also referred to as the OCCC. The MR coil circuit i.e. the OCMRC may include elements (e.g., resistors, capacitors, PIN diode, pre-amplifier) that conventionally reside on the MR coil.

In this system, when an MR coil is in the excitation zone, the coil connector associated with the MR coil creates a connection to one or more MR coil circuits. The electrical connection is made via the coil connector associated with MR coil and the circuit connectors associated with the one or more MR coil circuits. The electrical connection allows MR signals detected in the MR coil to flow to the one or more MR coil circuits. Due to the size and shape of the coil connector and the circuit connectors, the electrical connection produces a constant capacitance for the MR coil as it moves through the excitation zone and is connected to different members of the one or more MR coil circuits.

In one embodiment, the coil connector for an MR coil is a capacitive plate and thus the electrical connection is a capacitive connection. As described in equations 3-9, the capacitance of the circuit connectors can be controlled to produce constant capacitance as the coil connector moves along an arrangement of the circuit connectors. The shape of a connector may contribute to its capacitance. In one embodiment, the shape of a circuit connector for an MR coil circuit is a function of a shape of a neighboring circuit connector and the shape of a coil connector. The shapes may include polygonal shapes and non-polygonal shapes. In one embodiment, the circuit connectors are arranged in a repeating pattern of shapes that includes polygonal shapes and non-polygonal shapes.

In one embodiment, apparatus 700 may include an MR data acquisition unit that acquires MR data from an examination subject interacting with the MR data acquisition unit. The apparatus 700 may include a local coil in the MR data acquisition unit that participates in the acquisition of the MR data by transmitting RF signals into the examination subject and by receiving resulting MR signals from the examination subject. The local coil has a coil coupler element electrically connected to it and is mounted in the MR data acquisition unit. The apparatus 700 may also include a signal processor in the MR data acquisition unit remote from the local coil. Because elements of the local coil have been removed from the local coil but are present in the off coil circuits, the apparatus 700 may include a plurality of apparatus coupler elements mounted in the MR data acquisition unit that are electrically connected to the signal processing unit. The apparatus 700 may also include a moveable element (e.g., sliding table) on which the local coil is carried. The moveable element moves in a movement path in the MR data acquisition unit causing the coil coupler element to be in contact with one or more of the apparatus coupler elements at a time. The coil coupler element is disposed on the moveable element and the plurality of apparatus coupler elements are disposed on the MR data acquisition unit to cause the coil coupler element to electrically couple to the one or more members of the apparatus coupler elements within at least a segment of the movement path. The coil coupler element and the plurality of apparatus coupler elements have shapes and circuit designs that facilitate producing a constant capacitance between the coil coupler element and the one or more apparatus coupler elements as the coil coupler element moves in the movement path.

In one embodiment, the apparatus 700 may be part of a system that includes a base body that has a magnet system that generates magnetic fields in an examination region of the base body. The system may include a patient bed that is movable in a travel direction through a travel region relative to the base body. The patient bed may be configured to receive an examination subject thereon and to move the examination subject through the examination region. The system may include an antenna arrangement that is operable in combination with the magnet system to interact with the examination subject to generate MR signals in and receive MR signals from the examination subject. The antenna arrangement may include a local coil configured to at least detect the MR signals. The system may also include an evaluation device that evaluates the MR signals detected by the local coil. The local coil may not have all the elements traditionally found in an MR RF coil. Thus, the system may include a plurality of base body coupling elements that are connected to the evaluation device at predetermined base body locations and a patient bed coupling element that is connected to the local coil. The patient bed coupling element is located at a predetermined patient bed location at the patient bed. The plurality of base body coupling elements and the patient bed coupling element are respectively configured and located to couple the patient bed coupling element with one or more of the base body coupling elements as the local coil travels through the travel region in the travel direction. When the local coil is coupled to the base body coupling elements, the MR signals detected by the local coil may be fed from the local coil via the patient bed coupling element and the base body coupling elements to the evaluation device. Unlike conventional systems, the plurality of base body coupling elements and the patient bed coupling element are configured to produce a constant capacitance in the local coil while coupled together. In one embodiment, the constant capacitance may be created by maintaining a constant surface area between the patient bed coupling element and the one or more base body coupling elements with which the patient bed coupling element is in contact as the local coil moves through the travel region in the travel direction. In other embodiments, the constant capacitance is achieved by the combined capacitance in the circuits. It may be noted that the base body coupling element is same as the OCCC and the patient bed coupling element is same as the coil coupler.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. A system, comprising:
one or more coil couplers electrically connected to a corresponding number of minimalist magnetic resonance radio frequency (MMRRF) coils in a one-to-one manner, wherein each coil coupler is a capacitive plate;
a plurality of off coil circuitry couplers (OCCCs) electrically connected to a corresponding plurality of off coil MR circuits (OCMRCs) in a one-to-one manner, wherein each OCCC is a capacitive plate;
wherein the one or more coil couplers is moveable relative to the plurality of OCCCs by a magnetic resonance (MR) apparatus during an MR procedure,
wherein the one or more coil couplers and the plurality of OCCCs are arranged such that, at a given instance of time during the MR procedure, one OCCC can be in capacitive contact with at most one member of the one or more coil couplers, and one member of the one or more coil couplers can be in capacitive contact with one or more OCCCs, wherein when a member of the one or more coil couplers is in capacitive contact with one or more selected OCCCs, a MR signal detected by a MMRRF coil associated with the member of the one or more coil couplers is allowed to flow from the MMRRF coil to the one or more selected OCCCs via the member of the one or more coil couplers and wherein the MR signal further flows from the one or more selected OCCCs to one or more OCMRCs associated with the one or more selected OCCCs,
wherein when the member of the one or more coil couplers is in capacitive contact with the one or more selected OCCCs and while the member of the one or more coil couplers is moving relative to the plurality of OCCCs, there is a constant capacitance between the member of the one or more coil couplers and the one or more selected OCCCs to which the member of the one or more coil couplers is in capacitive contact with, and wherein the constant capacitance remains within a desired capacitance range for the MMRRF coil causing the MMRRF coil to remain tuned within a desired frequency range, and
wherein the capacitance for the MMRRF coil is described by:

$$\frac{C_1 C_d}{C_1 + 2C_d} + \frac{C_2 C_d}{C_2 + 2C_d} = \frac{C_0 C_d}{C_0 + 2C_d}$$

wherein:
- $C_d$ is the equivalent total break point capacitance produced by a decoupling capacitor on a member of the plurality of OCMRCs,
- $C_0$ is the capacitance produced during a capacitive coupling between the member of the one or more coil couplers and a single OCCC when the member of the one or more coil couplers is in capacitive connection with the single OCCC,
- $C_1$ is the capacitance produced by a first capacitive coupling between the member of the one or more coil couplers and a first OCCC when the member of the one or more coil couplers is in capacitive connection with the first OCCC and a second OCCC, where $C_1$ is a function of the shape of the first OCCC, and
- $C_2$ is the capacitance produced by a second capacitive coupling between the member of the one or more coil couplers and the second OCCC when the member of the one or more coil couplers is in capacitive connection with the first OCCC and the second OCCC, where $C_2$ is a function of the shape of the second OCCC.

2. The system of claim 1, wherein when the value for $C_1$ is known, $C_2$ is defined by:

$$C_2 = 2C_d \cdot \left( \frac{1}{1 + \frac{2C_d}{C_0 + 2C_d} - \frac{2C_d}{C_1 + 2C_d}} - 1 \right).$$

3. The system of claim 2, wherein the shape of the first OCCC is a function of the shape of the member of the one or more coil couplers and the second OCCC and where the shape of the second OCCC is a function of the shape of the member of the one or more coil couplers and the first OCCC.

4. The system of claim 3, wherein at least one member of the plurality of OCCCs is fin shaped.

5. The system of claim 3, wherein at least one member of the plurality of OCCCs is spade shaped and one member of the plurality of OCCCs is triangular in shape.

6. The system of claim 3, wherein the plurality of OCCCs are arranged in a repeating pattern.

7. The system of claim 3, wherein at least one member of the plurality of OCCCs has a polygonal shape and at least one member of the plurality of OCCCs has a non-polygonal shape.

8. The system of claim 3, wherein at least one member of the plurality of OCCCs is a dummy connector that is not connected to a receive channel.

9. The system of claim 8, where the plurality of OCCCs are arranged in a repeating pattern of alternating polygonal shapes and non-polygonal shapes.

10. A system, comprising:
- a magnetic resonance (MR) apparatus configured to move a patient through an excitation zone during an MR procedure;
- two or more MR coils, each MR coil comprising a loop and a coil connector, wherein the two or more MR coils are moved through the excitation zone during the MR procedure by the MR apparatus, and wherein at least one of the two or more MR coils acquires MR signals while in the excitation zone, and
- two or more MR coil circuits, wherein each MR coil circuit comprises a signal processing circuit and a circuit connector, wherein the shape of a circuit connector for a given MR coil circuit is a function of a circuit connector of a neighboring MR coil circuit and the shape of the coil connector,
- wherein when a MR coil is in the excitation zone, the coil connector of the MR coil creates a connection to N members of the two or more MR coil circuits via the circuit connectors associated with each of the N members of the two or more MR coil circuits, where N is an integer greater than or equal to one, and
- wherein the connection of the coil connector of the MR coil to the circuit connector of the N members of the two or more MR coil circuits allows the MR signal detected by the loop of the MR coil to flow to the signal processing circuit of the N members of the two or more MR coil circuits via the coil connector of the MR coil and the circuit connector of each of the N members of the two or more MR coil circuits, and wherein the connection produces a constant capacitance for the MR coil as the MR coil moves through the excitation zone and is connected to different N members of the two or more MR coil circuits.

11. The system of claim 10, wherein the coil connector of each of the MR coils is a capacitive plate and wherein the connection is a capacitive connection.

12. The system of claim 10, wherein the shape of a circuit connector for a given MR coil circuit is polygonal.

13. The system of claim 10, wherein the shape of a circuit connector for a given MR coil circuit is non-polygonal.

14. The system of claim 10, wherein the circuit connectors of the N MR coil circuits are arranged in a repeating pattern of shapes.

15. The system of claim 14, wherein the repeating pattern of shapes includes at least a polygonal shape and at least a non-polygonal shape.

16. The system of claim 10, wherein at least one of the circuit connectors is a dummy connector that is not connected to a MR coil circuit.

17. A magnetic resonance (MR) apparatus, comprising:
- an MR data acquisition unit that acquires MR data from an examination subject interacting with the MR data acquisition unit;
- a local coil in the MR data acquisition unit that participates in the acquisition of the MR data by transmitting radio frequency (RF) signals into the examination subject and by receiving resulting MR signals from the examination subject;
- wherein the local coil has a coil coupler element electrically connected thereto and mounted in the MR data acquisition unit;
- a signal processor remote from the local coil;
- a plurality of apparatus coupler elements mounted in the MR data acquisition unit that are electrically connected to the signal processing unit, and
- a moveable element on which the local coil is carried,
- wherein the moveable element moves in a movement path in the MR data acquisition unit causing the coil coupler element to be in contact with N of the plurality of apparatus coupler elements at a time, N being an integer greater than or equal to zero,
- wherein the coil coupler element is disposed on the moveable element and the plurality of apparatus coupler elements are disposed on the MR data acquisition unit to cause the coil coupler element to couple to N members of the apparatus coupler elements within at least a segment of the movement path, and
- wherein the coil coupler element and the plurality of apparatus coupler elements have shapes that produce a constant capacitance between the coil coupler element and the N apparatus coupler elements as the coil coupler element moves along the movement path.

18. A magnetic resonance (MR) system, comprising:
a base body comprising a magnet system, an examination region, an antenna arrangement with one of more local coils, an evaluation device, and a plurality of base body coupling elements,
wherein the magnet system is configured to generate magnetic fields in the examination region of the base body and antenna arrangement, in combination with the magnet system, is configured to interact with the examination subject to generate MR signals in and receive MR signals from the examination subject, and wherein the one or more local coils of the antenna arrangement is configured to at least detect the MR signals so received,
wherein the evaluation device is configured to evaluate the MR signals detected by the one or more local coils, and wherein the plurality of base body coupling elements are connected to the evaluation device, the base body coupling elements being located at predetermined base body locations,
a patient bed that is movable in a travel direction through a travel region relative to the base body, the patient bed being configured to receive an examination subject thereon and to move at least a part of the examination subject through the examination region; and
one or more patient bed coupling element connected to the local coil, wherein the one or more patient bed coupling element is located at a predetermined patient bed location at the patient bed,
wherein the plurality of base body coupling elements and the patient bed coupling element are respectively configured and located to couple one patient bed coupling element with N of the base body coupling elements as the local coil travels through the travel region in the travel direction to feed the MR signals detected by the local coil from the local coil via the patient bed coupling element and the base body coupling elements to the evaluation device, N being an integer greater than or equal to zero, and
wherein the plurality of base body coupling elements and the patient bed coupling element are configured to produce a constant capacitance in the local coil as the local coil moves through the travel region in the travel direction, where the constant capacitance is produced by maintaining a constant surface area between the patient bed coupling element and the one or more base body coupling elements with which the patient bed coupling element is in contact as the local coil moves through the travel region in the travel direction.

* * * * *